United States Patent
Bowen et al.

(10) Patent No.: US 11,243,589 B1
(45) Date of Patent: Feb. 8, 2022

(54) REMOTE POWER BUTTON ACTUATION DEVICE FOR A PRE-ASSEMBLED COMPUTER SYSTEM INTEGRATED INTO A SERVER FOR A VIRTUALIZATION SERVICE

(71) Applicant: Amazon Technologies, Inc., Seattle, WA (US)

(72) Inventors: Peter Zachary Bowen, Bainbridge Island, WA (US); Darin Lee Frink, Lake Tapps, WA (US); Eric Robert Northup, Seattle, WA (US); David A Skirmont, Los Gatos, CA (US); Manish Singh Rathaur, Kirkland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 100 days.

(21) Appl. No.: 16/581,654

(22) Filed: Sep. 24, 2019

(51) Int. Cl.
*G06F 1/26* (2006.01)
*G05B 15/02* (2006.01)
(Continued)

(52) U.S. Cl.
CPC .............. *G06F 1/26* (2013.01); *G05B 15/02* (2013.01); *G06F 8/65* (2013.01); *G06F 9/455* (2013.01);
(Continued)

(58) Field of Classification Search
CPC ... G06F 1/26; G06F 9/455; G06F 8/65; G05B 15/02; H05K 7/1488; H01H 3/42; H01H 3/28
(Continued)

(56) References Cited

U.S. PATENT DOCUMENTS

| 6,658,447 B2 | 12/2003 | Cota-Robles |
| 7,484,091 B2 | 1/2009 | Bade et al. |

(Continued)

FOREIGN PATENT DOCUMENTS

| EP | 1701259 | 9/2006 |
| EP | 2557498 | 2/2013 |

OTHER PUBLICATIONS

U.S. Appl. No. 16/017,886, filed Jun. 25, 2018, Upendra Bhalchandra Shevade et al.
Amazon, "Announcing Amazon EC2 Bare Metal Instances (Preview)", Retrieved from URL: https://aws.amazon.com/about-aws/whats-new/2017/11/announcing-amazon-ec2-bare-metal-instances-preview/, pp. 1-4.
(Continued)

*Primary Examiner* — Michael J Brown
(74) *Attorney, Agent, or Firm* — Robert C. Kowert; Kowert, Hood, Munyon, Rankin & Goetzel, P.C.

(57) ABSTRACT

A branded fleet server system includes a pre-assembled third-party computer system integrated into a chassis of the branded fleet server system. The pre-assembled third-party computer system is configured to execute proprietary software that is only licensed for use on branded hardware. A baseboard management controller (BMC) included in the server chassis couples with the pre-assembled computer system via one or more cables coupled to ports of the pre-assembled computer system. The BMC enables remote control of the pre-assembled computer system, such as remote power on and power off. An electro-mechanical device, such as a solenoid, presses a power button of the pre-assembled computer system based on control signals from the BMC to change a power state of the pre-assembled computer system.

20 Claims, 16 Drawing Sheets

(51) Int. Cl.
*G06F 9/455* (2018.01)
*G06F 8/65* (2018.01)
*H05K 7/14* (2006.01)
*H01H 3/28* (2006.01)
*H01H 3/42* (2006.01)

(52) U.S. Cl.
CPC ............... *H01H 3/28* (2013.01); *H01H 3/42* (2013.01); *H05K 7/1488* (2013.01)

(58) Field of Classification Search
USPC ............................. 713/300, 310, 320, 330
See application file for complete search history.

(56) References Cited

U.S. PATENT DOCUMENTS

| | | | |
|---|---|---|---|
| 7,493,436 | B2 | 2/2009 | Blackmore et al. |
| 7,698,707 | B2 | 4/2010 | Accapadi et al. |
| 7,996,836 | B1 | 8/2011 | McCorkendale et al. |
| 8,032,899 | B2 | 10/2011 | Archer et al. |
| 8,127,292 | B1 | 2/2012 | Dobrovolskiy et al. |
| 8,136,111 | B2 | 3/2012 | Mall et al. |
| 8,145,797 | B2 | 3/2012 | Floyd |
| 8,201,161 | B2 | 6/2012 | Challener et al. |
| 8,239,557 | B2 | 8/2012 | McCune et al. |
| 8,433,802 | B2 | 4/2013 | Head et al. |
| 8,514,868 | B2 | 8/2013 | Hill |
| 9,323,552 | B1 | 4/2016 | Adogla et al. |
| 9,361,145 | B1 | 6/2016 | Wilson et al. |
| 10,127,068 | B2 | 11/2018 | Liguori et al. |
| 10,318,311 | B2 | 6/2019 | Liguori et al. |
| 10,318,737 | B2 | 6/2019 | Liguori et al. |
| 2004/0215932 | A1 | 10/2004 | Burky et al. |
| 2005/0251806 | A1 | 11/2005 | Auslander et al. |
| 2008/0126627 | A1* | 5/2008 | Chandrasekhar ........ G06F 3/023 710/62 |
| 2008/0244553 | A1 | 10/2008 | Cromer et al. |
| 2010/0070970 | A1 | 4/2010 | Hu et al. |
| 2010/0115077 | A1* | 5/2010 | Tameshige ............. H04L 41/06 709/223 |
| 2011/0131443 | A1 | 6/2011 | Laor et al. |
| 2013/0054948 | A1 | 2/2013 | Raj et al. |
| 2016/0026573 | A1 | 1/2016 | Jacobs et al. |
| 2016/0077845 | A1 | 3/2016 | Earl et al. |
| 2016/0170781 | A1 | 6/2016 | Liguori et al. |
| 2017/0024570 | A1 | 1/2017 | Pappachan et al. |
| 2018/0114000 | A1 | 4/2018 | Taylor |

OTHER PUBLICATIONS

Brendan Gregg's Blog, "AWS EC@ Virtualization 2017: Introducing Nitro", Retrieved from URL: http://www.brendangregg.com/blog/2017-11-29/aws-ec2-virtualization-2017.html, pp. 1-11.
U.S. Appl. No. 15/905,681, filed Feb. 26, 2018, Uphendra Bhalchandra Shevade, et al.
U.S. Appl. No. 16/581,651, filed Sep. 24, 2019, Peter Zachary Bowen.
U.S. Appl. No. 16/581,650, filed Sep. 24, 2019, Peter Zachary Bowen.
AMD, "Secure Encrypted Virtualization API Version 0.16 Technical Preview", Advanced Micro Devices, Publication 55766, Revision 3.06, Feb. 2018. pp. 1-99.
Ittai Anati, et al., "Innovative Technology for CPU Based Attestation and Sealing", Retrieved from https://software.intel.com/en-us/articles/innovative-technology-for-cpu-based-attestation-and-sealing on Feb. 9, 2019, pp. 1-19.
MacStaadium Hosted Mac Private Cloud Solutions, "What makes a private cloud different", https://macstadium.com/cloud, pp. 1-7.
Sonnet Technologies Inc., "xMac mini Server", dated 2019, pp. 1-5.
U.S. Appl. No. 16/581,619, filed Sep. 24, 2019, Anthony Nicholas Liguori.
U.S. Appl. No. 15/817,071, filed Nov. 17, 2017, Cai, Diem K.
U.S. Appl. No. 16/147,460, filed Sep. 28, 2018, Marcin Piotr Kowalski.
Changhee Jung, et al., Adaptive execution techniques for SMT multiprocessor architectures:, PPoPP'05, ACM, Jun. 15-17, 2005, pp. 236-246.
Nael Abu-Ghazaleh, et al., "How the Spectre and Meltdown Hacks Really Worked", Retrieved from https://spectrum.ieee.org/computing/hardware/how-the-spectre-and-meltdown-hacks-really-worked on Jun. 3, 2019, pp. 1-18.
Microsoft Tech Community, Hyper-V HyperClear Mitigation for L1 Terminal Fault, Retrieved from https://techcommunity.microsoft.com/t5/Virtualization/Hyper-V-HyperClear-Mitigation-for-L1-Terminal-Fault/ba-p/382429 on Jun. 21, 2019, pp. 1-11.
Deborah T. Marr, et al., "Hyper-Threading Technology Architecture and Microarchitecture", Intel Technology Journal Q1, 2002, pp. 1-12.
Alexander Chartre, KVM Address Space Isolation, Retrieved from https://lwn.net/Articles/788273/ on Jun. 21, 2019, pp. 1-6.
Andy Greenberg, "Meltdown Redux: Intel Flaw Lets Siphon Secrets From Millions of PCs", Retrieved from https://www.wired.com/story/intel-mds-attack-speculative-execution-buffer/ on Jun. 3, 2019, pp. 1-20.
Microsoft, "Protect your Windows devices against speculative execution side-channel attacks", Retrieved from https://support.microsoft.com/en-us/help/4073757/protect-windows-devices-from-speculative-execution-side-channel-attack on Jun. 5, 2019, pp. 1-10.
Jochen Liedtke, et al., "Lazy Process Switching", Proceedings Eighth Workshop on Hot Topics in Operating Systems, IEEE, 2001, pp. 13-16.
Alexandre Chartre, "LKML: Kernel Address Space Isolation", Retrieved from https://lkml.org/lkml/2019/7/11/351 on Jul. 20, 2019, pp. 1-5.
U.S. Appl. No. 16/552,772, filed Aug. 27, 2019, Amit Shah.
U.S. Appl. No. 16/196,723, filed Nov. 20, 2018, Anthony Nicholas Liguori.
U.S. Appl. No. 15/173,445, filed Jun. 3, 2016, Wilson, et al.
U.S. Appl. No. 14/869,907, filed Sep. 29, 2015, David Sean Russell.
U.S. Appl. No. 14/864,682, filed Sep. 24, 2015, Danilov, et al.
U.S. Appl. No. 14/535,056, filed Nov. 6, 2014, Potlapally, et al.
U.S. Appl. No. 15/199,489, filed Jun. 30, 2016, Liguori, et al.
U.S. Appl. No. 15/199,479, filed Jun. 30, 2016, Liguori, et al.
Zsgur Ulusoy, "Processing Real-Time Transactions in a Replicated Database System," 1994 Kluwer Academic Publishers, Boston, Revised Sep. 10, 1993, pp. 1-32.
Sergio Almeida, et al., "ChainReaction: a Causal+ Consistent Datastore based on Chain Replication," Eurosys'13 Apr. 15-17, 2013, Prague, Czech Republic, Copyright 2013 ACM 978-1-4503-1994-2/13/04, pp. 85-98.
Scott Lystig Fritchie, "Chain Replication in Theory and in Practice," Erlang'10, Sep. 30, 2010, Baltimore, Maryland, USA. Copyright 2010 ACM 978-1-4503-0253-1/10/09, pp. 1-11.
Robbert van Renesse, et al., "Chain Replication for Supporting High Throughput and Availability," USENIX Association, OSDI 2004: 6th Symposium on Operating Systems Design and Implementation, pp. 91-104.
Philip A. Bernstein, et al, "Concurrency Control and Recovery in Database Systems," Addison-Wesley Publication Company, ISBN 0-201-10715-5, 1987, pp. 1-58.
From Wikipedia, the free encyclopedia, "Bromium," downloaded on Jun. 27, 2016 from https://en.wikipedia.org/wiki/Bromium, pp. 1-4.
Xen, "Dom0" downloaded Jun. 6, 2016 from http://wiki.xen.org/wiki/Dom0, last updated Mar. 29, 2015, pp. 1-2.
Amazon Web Services, "Amazon Elastic Compute Cloud: User Guide for Linux Instances," Latest Version update 2015, pp. 1-816.
IBM, General Information, Version 4, Release 3.0, Fifth Edition, Apr. 2002, pp. 1-101.
From Wikipedia, the free encyclopedia, "Hypervisor," downloaded Jun. 6, 2016 from https://en.wikipedia.org/wiki/Hypervisor, pp. 1-7.
Axel Buecker, et al., "Reduce Risk and Improve Security on IBM Mainframes: vol. 1 Architecture and Platform Security," Redbooks, IBM, Dec. 2014, pp. 1-308.

(56) References Cited

OTHER PUBLICATIONS

From Wikipedia, the free encyclopedia, "VMware ESX," downloaded Jun. 6, 2016 from https://en.wikipedia.org/wiki/VMware_ESX, pp. 1-13.
From Wikipedia, the free encyclopedia, "Xen," downloaded from Jun. 6, 2016 from https://en.wikipedia.org/wiki/Xen, pp. 1-12.
U.S. Appl. No. 15/236,116, filed Aug. 12, 2016, Konrad Jan Miller et al.
International Search Report and Written Opinion from PCT/US2017/040049, dated Sep. 13, 2017, Amazon Technologies, Inc., pp. 1-12.
Udo Steinberg, et al., "NOVA: A Microhypervisor-Based Secure Virtualization Architecture", ACM, EuroSys'10, Apr. 13-16, 2010, pp. 209-222.
Sangster, et al., TCG Published, Virtualized Trusted Platform Architecture Specification, Specification Version 1.0, Revision 0.26, Sep. 27, 2011, pp. 1-60.
Network Functions Virtualisation (NFV); NFV Security; Security and Trust Guidance, ETSI GS NFV-SEC 003, V1.1.2, downloaded by EP on Jun. 4, 2016, pp. 1-57.
U.S. Appl. No. 15/374,520, filed Dec. 9, 2016, Akhilesh Mritunjai.
Nternational Search Report and Written Opinion from PCT/US2017/040066, dated Sep. 21, 2017, Amazon Technologies, Inc., pp. 1-11.
Cong Xu, et al., "vSlicer: Latency-Aware Virtual Machine Scheduling via Differentiated-Frequency CPU Slicing", Purdue University, Purdue e-Pubs, 2012, pp. 1-14.
U.S. Appl. No. 16/196,736, filed Nov. 20, 2018, Anthony Nicholas Liguori et al.
International Search Report and Written Opinion from PCT/US2017/040076, dated Oct. 6, 2017, pp. 1-13.
Amazon Web Services, "Amazon Elastic Compute Cloud: User Guide for Linux Instances," Latest Version update 2018, pp. 1-884.
Amazon Web Services, "Amazon Elastic Container Service: Developer Guide" API Version, Nov. 13, 2014, pp. 1-386.
Amazon Web Services, "AWS Lambda: Developer Guide" 2018, pp. 1-539.
AWS, "Annoucing Amazon EC2 Bare Metal Instances (Preview)", Retrieved from URL: https://aws.amazon.com/about-aws/whats-new/2017/11/announcing-amazon-ec2-bare-metal-instances-preview/ on Jan. 15, 2018, pp. 1-4.

* cited by examiner

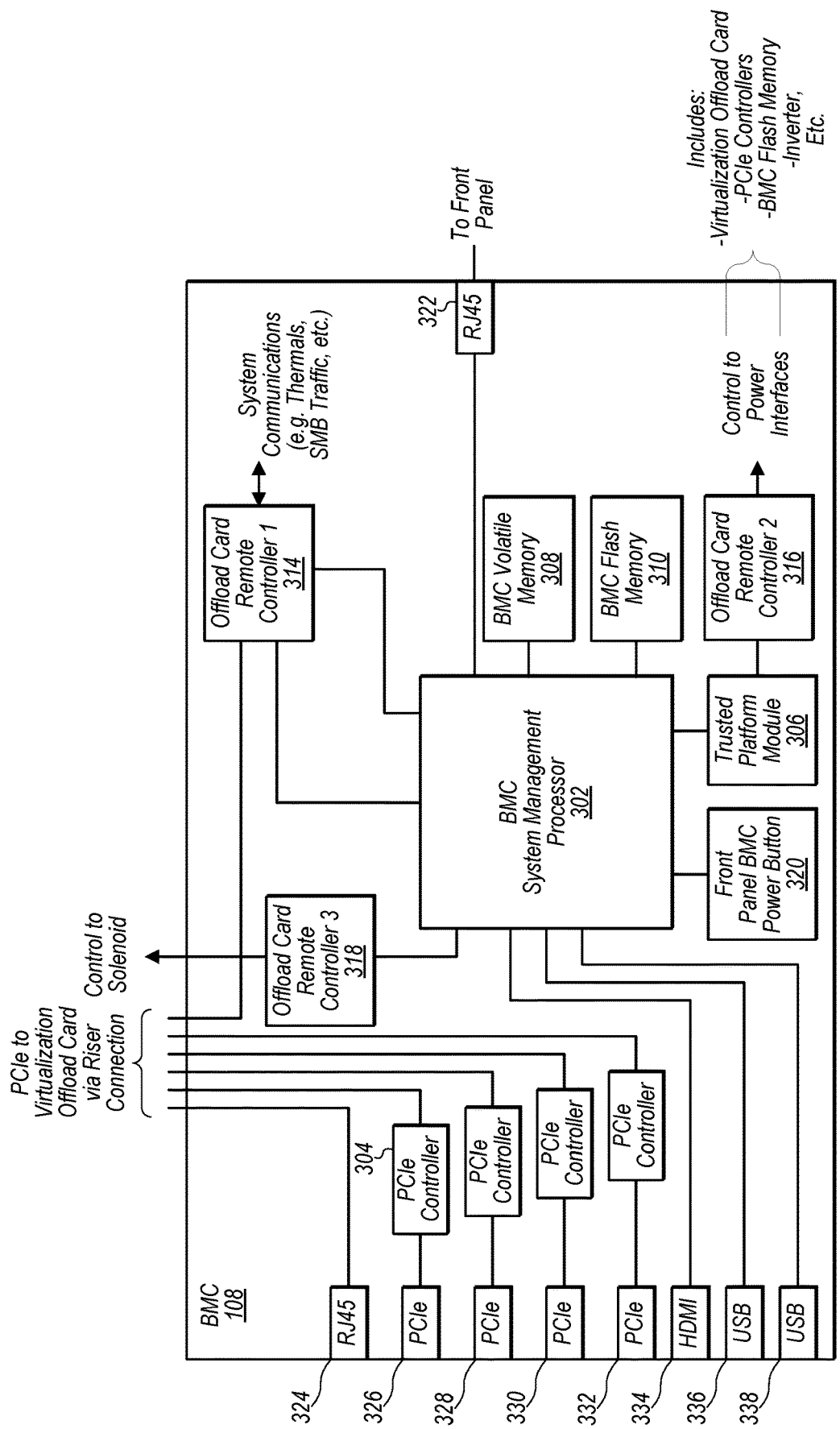

Example virtualization management software components run at virtualization offloading component cores/processors
402

- Embedded operating system
  404

- Network interface card (NIC) emulators
  406

- Legacy device emulators
  408

- Block-device storage managers
  (e.g., for configuring root volume of compute instance)
  410

- NVME device emulators
  412

- IVN data plane connectivity managers
  (e.g., performing encapsulation protocol operations, mapping service calls, etc.)
  414

- Instance metadata service agents
  416

- Cloud computing service control plane agents
  418

- Network security agents
  (e.g., DNS request loggers)
  420

REMOTE POWER BUTTON ACTUATION DEVICE FOR A PRE-ASSEMBLED COMPUTER SYSTEM INTEGRATED INTO A SERVER FOR A VIRTUALIZATION SERVICE

BACKGROUND

The advent of virtualization technologies for commodity hardware has provided benefits with respect to managing computing resources for many users with diverse needs, allowing various computing resources to be efficiently and securely shared by multiple users. For example, virtualization technologies may allow a single physical virtualization host to be shared among multiple users by providing each user with one or more compute instances (such as "guest" virtual machines) hosted by the single virtualization host. Each such compute instance may represent a software simulation acting as a distinct logical computing system that provides users with the illusion that they are the sole operators of a given hardware computing resource, while also providing application isolation and security among the various virtual machines. Instantiating several different compute instances on the same host (e.g. hardware computing resource) may also help increase overall hardware utilization levels, leading to more efficient use of resources.

A cloud provider network (sometimes referred to simply as a "cloud") refers to a large pool of network-accessible computing resources (such as compute, storage, and networking resources, applications, and services), which may be virtualized or bare-metal. The cloud can provide convenient, on-demand network access to a shared pool of configurable computing resources that can be programmatically provisioned and released in response to customer commands. These resources can be dynamically provisioned and reconfigured to adjust to variable load.

BRIEF DESCRIPTION OF DRAWINGS

FIG. 3 illustrates example elements of a baseboard management controller (BMC) that may be included in a server system with a pre-assembled computer system, according to some embodiments.

FIG. 4 illustrates example virtualization management software components which may be executed at a virtualization offloading component included in a server system with a pre-assembled computer system, according to some embodiments.

Figure 1:
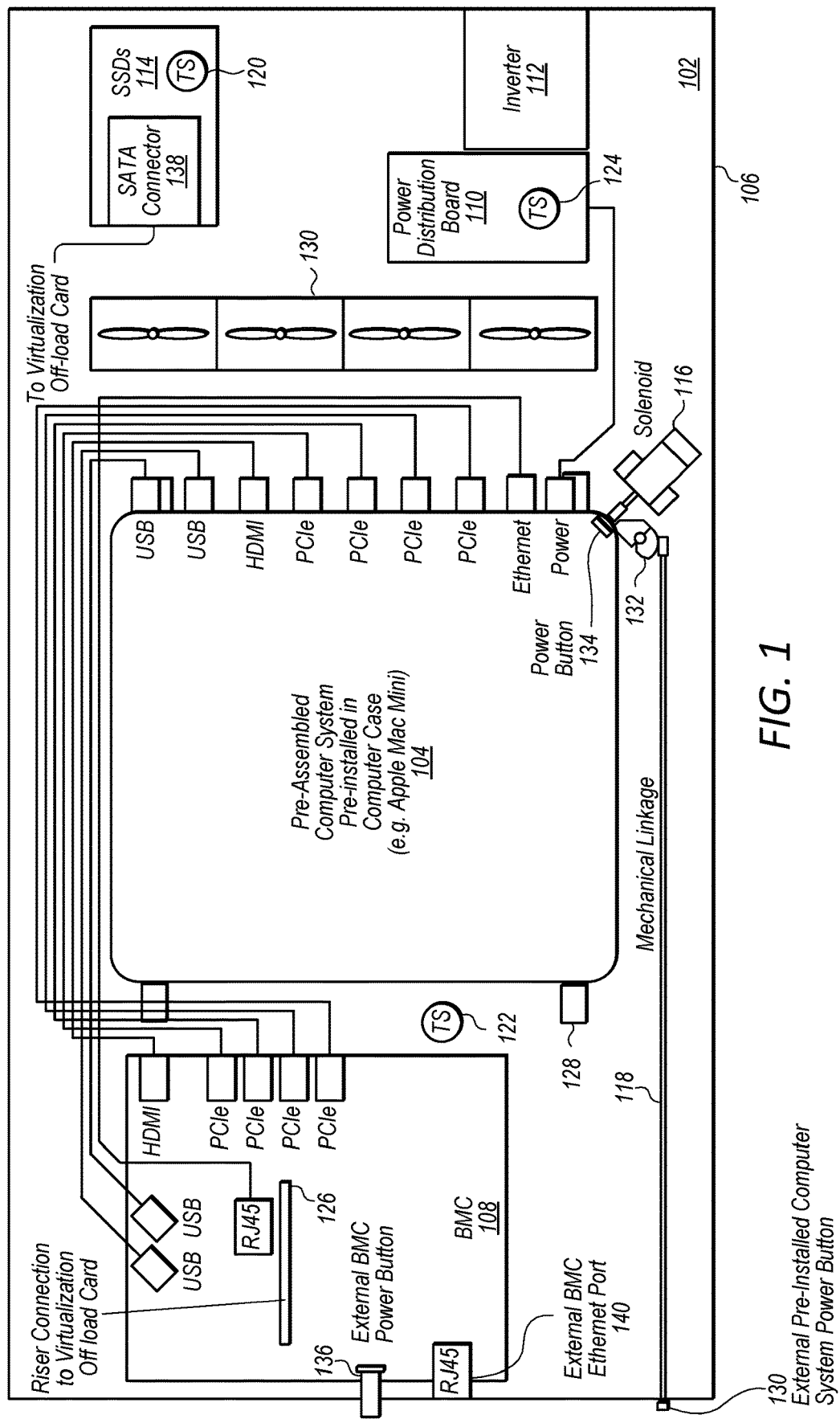
FIG. 1 illustrates a server system that includes a pre-assembled computer system mounted in a server chassis along with a baseboard management controller (BMC) that is connected to virtualization offloading component included in the server chassis, external to the pre-assembled computer system, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and apparatus for providing resources (such as compute instances) of in a cloud provider network that execute proprietary third-party software using pre-assembled third-party computer hardware, and more generally to technology for integrating consumer-ready (e.g., out-of-the-box, pre-assembled, pre-loaded with third-party software) third-party devices into the cloud provider network. In some implementations, the cloud provider network may offer compute instances relating to the Apple, Inc. Mac Mini, Mac Pro, or other third-party consumer electronics computer platforms such as mobile communication devices (e.g., Android phones, iPhones), smart watches, smart appliances, and gaming consoles. Some consumer electronics devices that are integrated into a cloud provider network as described herein may run third-party proprietary software, while others may run third-party open source software. Some consumer electronics companies may limit the use of their proprietary software, such as an operating system (OS), such that the proprietary software may only be used on hardware manufactured by, branded by, or otherwise approved by that particular consumer electronics company. For example, Apple, Inc. restricts the use of Apple operating systems (Mac OSs) to exclusively be used on Apple branded hardware. Also, some computing users may develop, build, test, etc. software products that are configured to execute in a particular operating system environment, such as in a Mac OS environment, Android OS environment, or other mobile and/or desktop OS environment. In such circumstances, in order to offer compute instances that use the computer hardware manufacturer's proprietary software, a cloud provider network operator may be required to purchase and integrate fully assembled computer systems containing the combination of hardware and proprietary software that has been approved by the third-party into the operator's cloud.

However, it may not be feasible or economical for such computing users to purchase and manage large fleets of branded hardware executing such proprietary software (such as Apple branded hardware executing a Mac OS) to develop, build, test, etc. such software products. The inclusion of fully-assembled computer systems into a fleet of virtualization hosts may present various challenges for the efficient operation and management of the cloud provider network. For example, the fully-assembled computer systems may not be designed to allow for remote firmware updates or remotely turning the fully-assembled computer systems off and on. In addition, the fully-assembled computer systems may not be designed to be integrated into the physical infrastructure of the cloud provider network (e.g., server racks), or to operate with a hypervisor used to virtualize resources in the cloud provider network. Additionally, there may be other obstacles in order to integrate a fully-assembled computer system into a fleet of virtualization hosts of a virtual computing service.

The presently disclosed technology addresses these challenges, among others, by physically integrating third-party devices into cloud provider physical infrastructure, and by creating a virtual environment around the third party devices that mimic the inputs the third party devices expect during conventional consumer use (e.g., power button interactions, control signals, cooling). In some embodiments, third-party devices configured with a proprietary third-party operating system (such as Apple branded hardware configured with a Mac OS), may be integrated into a cloud provider network that offers computing instances (e.g. virtual machines) to customers of the cloud provider network. In some embodiments, the customers may be software developers or others that need to develop, build, test, etc. software designed to execute in a particular operating system environment.

The cloud provider network may offer virtual compute instances with varying computational and/or memory resources. In one embodiment, each of the virtual compute instances may correspond to one of several instance types. An instance type may be characterized by its hardware type, computational resources (e.g., number, type, and configuration of central processing units [CPUs] or CPU cores), memory resources (e.g., capacity, type, and configuration of local memory), storage resources (e.g., capacity, type, and configuration of locally accessible storage), network resources (e.g., characteristics of its network interface and/or network capabilities), and/or other suitable descriptive characteristics. Using instance type selection functionality, an instance type may be selected for a customer, e.g., based (at least in part) on input from the customer. For example, a customer may choose an instance type from a predefined set of instance types. As another example, a customer may specify the desired resources of an instance type and/or requirements of a workload that the instance will run, and the instance type selection functionality may select an instance type based on such a specification. According to the present disclosure, one or more instance types of the cloud provider network may be instantiated on third-party hardware to run a proprietary third-party OS. In some embodiments, a common hypervisor system may manage both compute instances instantiated on the third-party hardware that run the third-party OS, as well as compute instances instantiated on various other types of hardware that run various other types of operating systems. Additionally, the same remote management controls may be employed to control both the third-party and in-house hardware executing the various operating systems.

In some embodiments, the disclosed technology can be used to integrate a pre-assembled computer system that is pre-installed in a computer case or other shell (such as an Apple branded computer system in a closed computer case that is configured to execute a Mac OS) into a server host, such that compute instances running the third-party OS can be included in a cloud computing service fleet. In some embodiments, a cloud computing service may also be referred to herein as a virtualized computing service. In some embodiments, a cloud computing service may comprise a virtualized computing service that implements virtualized compute instances and the cloud computing service may also implement at least some bare-metal compute instances. The server host may include a baseboard management controller (BMC) for remotely controlling the pre-assembled computer system and a virtualization offloading component for managing virtualization operations for instances to be launched on the pre-assembled computer system, wherein the BMC and the virtualization offloading component are included in a same server chassis with the pre-assembled computer system.

The virtualization offloading component may manage, at least in part, communications between compute instances instantiated on the pre-assembled computer system and other computing instances of the cloud computing service. Additionally or alternatively, the virtualization offloading component may manage communications between compute instances instantiated on the pre-assembled computer system and one or more other services of a provider network that includes the cloud computing service or devices external to the provider network. For ease of description, a virtualized offloading component is referred to herein. However, it should be noted that in some embodiments, a virtualization offloading component may perform similar functions for bare-metal instances.

In some embodiments, the virtualization offloading component may provide a compute instance instantiated on the pre-assembled computer system access to a client selected machine image stored in a block-based storage service of the provider network for use in booting the compute instance (e.g. virtual machine) on the pre-assembled computer system. Also, in some embodiments, the virtualization offloading component may manage network traffic between a compute instance instantiated on the pre-assembled computer system and other instances or services of the provider network. For example, the virtualization offloading component may route packets to or from the compute instance over a substrate network of the cloud computing service and may perform encapsulation or address re-direction of the packets. In some embodiments, a cloud services offloading component may perform similar network traffic management functions for bare-metal instances included in a cloud service provider network. Additionally, the virtualization offloading component and/or cloud services offloading component may manage security for a compute instance instantiated on the pre-assembled computer system. For example, the virtualization offloading component or cloud services offloading component may encrypt and decrypt incoming and outgoing traffic and may manage security keys for the compute instance instantiated on the pre-assembled computer system. Additionally, the virtualization offloading component may manage traffic such that a given compute instance instantiated on a pre-assembled computer system is included in an isolated virtual network, e.g. a virtual private cloud, and may manage address translation between private and/or public addresses for the compute instance. In some embodiments, these virtualization tasks may be performed on processors or cores of the virtualization offloading component that are separate from hardware of the pre-assembled computer system, but that are included in the same server chassis with the pre-assembled computer system.

The baseboard management controller (BMC), may, in conjunction with the virtualization offloading component, enable remote control of the pre-assembled computer system included in the server chassis with the BMC. For example, the BMC may be connected to the pre-assembled computer system via one or more cables connected to USB ports, display ports, etc. of the pre-assembled computer system and may emulate devices that the pre-assembled computer system expects to see attached to the pre-assembled computer system. For example, the BMC may emulate a monitor, a keyboard, a mouse, etc. In some circumstances, the pre-assembled computer system may be designed to only allow some operations, such as software updates or firmware updates, to be initiated via connected user interface devices, such as a keyboard, a mouse, and/or a monitor. In such circumstances, a BMC may emulate such user interface devices to allow for the operations (e.g. software updates and/or firmware updates) to be performed remotely without a user actually interacting with a keyboard, mouse, etc.

In some embodiments, an electro-mechanical device, such as a solenoid, may be included in a server chassis along with a pre-assembled computer system. The electro-mechanical device may be connected to the BMC and may be positioned in the server chassis to press a power button of the pre-assembled computer system. In some embodiments, the electro-mechanical device may change a power state of the pre-assembled computer system by pressing a power button in response to being issued a control command to actuate.

In some embodiments, a virtual computing service may remotely operate a pre-assembled third-party computer system via a virtualization offloading component and/or BMC. In some embodiments, a BMC may include a remote virtualization offloading controller that is in communication with a virtualization offloading component included in a server chassis with the BMC. In some embodiments, the virtualization offloading component may include a root of trust component and may permit or prohibit actions from being taken by the BMC based on whether or not a root of trust can be verified. Additionally, the pre-assembled computer system may include a separate root of trust used to boot the pre-assembled computer system and the root of trust of the virtualization offloading component may be an additional layer of trust in addition to that of the pre-assembled computer system.

In some embodiments, a virtualized computing service and/or cloud computing service may be one of among a plurality of network-accessible services (e.g., including storage services, database services, etc.) implemented at a provider network or in a cloud computing environment. The servers comprising pre-assembled third party computer systems may be located at data centers of such a provider network, at co-location facilities (e.g., a location such as a building or room in which computing-related resources of more than one organization may be hosted), and/or at client-owned premises connected to the provider network via a network connection.

In some embodiments, the server chassis that are configured to accept a pre-assembled third-party computer system may include various elements of hardware in addition to the pre-assembled third party computer system (e.g., including processors/cores, memories, storage devices, circuitry for power management, security management and the like) and software that collectively implement network and storage virtualization management, provide access to storage volumes via block-device interfaces, and incorporate the compute instances instantiated on the pre-assembled computer system within isolated virtual networks (IVNs) or other logical networks set up for the client at the virtualized computing service or cloud computing service.

The pre-assembled computer system may be connectable in a server chassis of a server system as described herein using industry-standard components, such as cables and connectors. For example, for any pre-assembled third-party computer system that adheres to widely used industry standards for peripheral connectivity (such as Peripheral Component Interconnect—Express (PCIe) or Universal Serial Bus (USB)), the functionality incorporated within the virtualization offloading component and/or BMC may allow compute instances launched at the pre-assembled third party computer system to obtain all the benefits (e.g., manageability, security, connectivity to other network-accessible services, and the like) provided to compute instances set up on a fleet of non-branded servers selected or designed by the operator of the virtualized computing service or cloud computing service. The compute instances set up at non-branded servers selected by the operators of the virtualized computing service or the cloud computing service may be referred to as default-fleet (DF) compute instances, while the compute instances set up at the servers comprising branded pre-assembled third party computer systems, may be referred to as branded-fleet (BF) compute instances.

The provider network can include a physical network (e.g., sheet metal boxes, cables) referred to as the substrate. The provider network can also include an overlay network of virtualized computing resources that run on the substrate. As such, network packets can be routed along a substrate network according to constructs in the overlay network (e.g., VPCs, security groups). In various embodiments, the substrate network for a virtualized computing service or cloud computing service may comprise hardware servers used for the default-fleet compute instances and branded-fleet compute instances, as well as various other devices (such as networking intermediary devices including routers, switches, gateways and the like) may be connected. Utilizing the substrate network as underlying infrastructure, logical networks may be configured in such embodiments on behalf of various virtualized computing service clients or cloud computing service clients. For example, a set of compute instances (including virtual machines, bare-metal instances that allow un-virtualized access to at least some hardware components of the underlying servers, etc.) may be configured on behalf of client C1 within a logical network called an isolated virtual network IVN1 (also referred to herein a virtual private cloud or VPC), while another set of compute instances may be configured on behalf of a different client C2 within another isolated virtual network IVN2.

An isolated virtual network (IVN) or virtual private cloud (VPC) may comprise a collection of networked resources (including compute instances) assigned or allocated to a given client, which are logically isolated from (and by default, inaccessible from) resources allocated for other clients in other isolated virtual networks or other virtual private clouds. The client on whose behalf an IVN (or VPC) is established may be granted substantial flexibility regarding network configuration for the resources of the IVN (or VPC)—e.g., private IP addresses for compute instances may be selected by the client without having to consider the possibility that other resources within other IVNs (or VPCs) may have been assigned the same IP addresses, subnets of the client's choice may be established within the IVN (or VPC), security rules may be set up by the client for incoming and outgoing traffic with respect to the IVN (or VPC), and so on.

Furthermore, in at least some embodiments, custom network endpoints may be set up within IVNs (or VPCs) to enable compute instances of the IVN (or VPC) to communicate with network-accessible services of the provider network (such as storage services, database services, machine learning services, etc.) using private network pathways of the provider network, without having to traverse or use links or devices of the public Internet. In various embodiments, the network addresses assigned to compute instances within an IVN (or VPC) may differ from the substrate network addresses assigned to the hardware servers on which the compute instances run. An encapsulation protocol and associated mapping service may be used to route the flows of network traffic within and across the IVNs (or VPCs) (e.g., from one compute instance to another, between client devices external to the virtualized computing service or cloud computing service and the compute instances, or between compute instances and other provider network services) over the links and servers of the underlying substrate network in various embodiments. The virtualized computing service or cloud computing service may also comprise a set of administrative or data plane components in various embodiments, responsible for tasks such as provisioning hardware, monitoring other resources, receiving and processing instance configuration commands from clients, and so on.

As one skilled in the art will appreciate in light of this disclosure, certain embodiments may be capable of achieving various advantages, including some or all of the following: (a) enabling customers of a virtualized computing service or cloud computing service to access compute instances implemented using proprietary (or open source) third-party software, such as an Apple Mac OS or an Android OS, (b) using pre-assembled third-party hardware servers configured with third-party software while still retaining the operational advantages (such as manageability/monitoring, connectivity to other provider network services, etc.) afforded default fleet servers, and/or (c) maintaining the security of sensitive application data when executed in a third-party software environment.

In various embodiments, guiding principles and goals underlying the design and implementation of servers configured to accept pre-assembled third-party computer systems configured to execute third-party proprietary (or open source) software that are used for enabling compute instances may include, among others: (a) using industry standards-compliant connectivity technologies and protocols, (b) providing fully automated remote management of power, cooling, software updates, firmware updates, etc. of the pre-assembled third-party computer systems (c) ensuring customer data security by restricting and thoroughly logging network traffic, and providing physical mechanisms (such as physical keys) to ensure that the data stored on the virtualization offloading component, the pre-assembled third-party computer system, and/or storage devices included in the server system with the pre-assembled third-party computer system cannot be stolen, (d) providing first-class support for a variety of provider network services (equivalent to the support possible using default fleet servers), and/or (e) protecting the provider network's own data centers from potential hostile actors.

In at least some embodiments, the virtualized computing service or cloud computing service may offer its clients the ability to set up compute instances on third-party computer systems executing proprietary (or open source) software, such as a proprietary OS, in either multi-tenant mode (in which a given third-party pre-assembled computer system may be used to launch and run compute instances of several different clients) or in single-tenant mode (in which a given third-party pre-assembled computer system may be used to launch and run compute instances of no more than one client). One of the single-tenant options may include allocating a client a virtualization server designated as a "dedicated virtualization host", enabling the client to specify/identify the virtualization server as the resource to be used for one or more compute instances without sharing the host with other clients, and enabling the client to use server-based software licenses (e.g., per-hardware-socket, per-core, or per-virtual-machine) license.

The virtualization offloading component may initiate one or more configuration operations of a compute instance on behalf of the client in various embodiments, including for example launching the compute instance, changing networking or other configuration settings, terminating the instance, and so on. In at least one embodiment, a bare metal compute instance may be instantiated on a third-party pre-assembled computer system on behalf of the client via a virtualization offloading component included in a server chassis with the third-party pre-assembled computer system, enabling un-virtualized access to at least some of the third-party pre-assembled computer system's hardware devices/components. In various embodiments, a compute instance implemented on a third-party pre-assembled computer system may be configured within an isolated virtual network of the provider network based at least in part on operations performed using the one or more networking managers running at a virtualization offloading component included in a server chassis with the third-party pre-assembled computer system. Such networking managers may, for example, store an indication of a network address (within a range of private network addresses of an isolated virtual network established at the virtualized computing service or cloud computing service) which has been assigned to a compute instance configured at the third-party pre-assembled computer system, and/or may assign such an address to a virtual network interface programmatically attached to such a compute instance.

In some embodiments, a compute instance of a third-party pre-assembled computer system may be provided access to a root volume (and/or other logical storage devices, file systems, and the like) based at least in part on operations performed by the one or more storage managers running at the virtualization offloading component included in the server chassis with the third-party pre-assembled computer system. For example, in some embodiments the storage managers may set up, modify, or otherwise configure the root volume using a block-storage service of the provider network, and/or other logical storage devices, file systems and the like. In some embodiments, the virtualization offloading component may comprise one or more persistent storage devices (e.g., devices accessible via an NVME (non-volatile memory express) interface) at which the contents of the root volume and/or other storage objects accessed from the compute instances of the third-party pre-assembled computer system may be stored. Additionally, or alternatively, the virtualization offloading component may be connected, for example, via a SATA cable connection, to one or more solid-state drives included in the server chassis at which the contents of the root volume and/or other storage objects accessed from the compute instances of the third-party pre-assembled computer system may be stored.

In some embodiments the virtualization offloading component and/or the baseboard management controller (BMC) may be connected to the third-party pre-assembled computer system via one or more PCIe connectors. In other embodiments, a connector configured to multiplex PCIe signals with other types of signals (such as a connector that multiplexes PCIe signals with DisplayPort signals) may be used, and/or a USB (Universal Serial Bus) connector may be used. In some embodiments, PCIe based connection interfaces, such as Thunderbolt connectors and a Thunderbolt controller, such as those designed by Intel Corp. and included in Apple Branded computer systems, may be used. Thunderbolt is a hardware Interface that allows the connection of external peripherals to a computing device, for example supporting up to six peripherals with one connector. Thunderbolt combines PCIe and DisplayPort into two serial signals and additionally provides DC power, all in one cable. DisplayPort is a digital display interface that implements a packetized data transmission protocol, and which can be used to connect a video source to a display device. DisplayPort can transmit audio data and video data simultaneously, as well as send other forms of data.

According to at least one embodiment, the networking managers of the virtualization offloading component may include a network interface card (NIC) emulator and/or an IVN connectivity manager. Encapsulation/de-capsulation operations of the encapsulation protocol of the virtualized computing service or cloud computing service may be implemented at the networking managers in some embodiments, e.g., for packets directed from a default-fleet (DF) compute instance within a particular IVN to a branded-fleet (BF) compute instance running at the same IVN or a different IVN. In at least one embodiment, the networking managers of the virtualization offloading component may be configured to log various types of network traffic directed to and/or from the compute instance(s), e.g., including Domain Name Service traffic directed to DNS servers in or outside the provider network, and provide such logs via programmatic interfaces to the client on whose behalf the compute instance is configured.

A number of programmatic interfaces (e.g., web-based consoles, command-line tools, graphical user interfaces, application programming interfaces (APIs) and the like) may be implemented by the cloud computing service (which may include a virtualized computing service) to enable clients to submit requests pertaining to compute instances in various embodiments and receive corresponding responses. For example, a client may submit a programmatic request to instantiate a compute instance on a third-party pre-assembled computer system. In some embodiments, a cloud computing service may dynamically increase or decrease provisioned compute instances that execute in a third-party proprietary (or open source) software environment. For example, a client may request more or few instances via a command-line tool or graphical user interface and the cloud computing service may dynamically add or remove compute instances from the client's pool of allocated resources. Also, a client may dynamically add or remove compute instances that execute in a third-party proprietary (or open source) software environment to or from isolated virtual networks or VPCs allocated to the client.

In some embodiments, the server chassis that accepts a third-party pre-assembled computer system may include a persistent storage device and the virtualization offloading component and/or the BMC may comprise an associated cryptographic storage security device (such as a physical key). A removal of the cryptographic storage security device may render the contents of the persistent storage device unreadable/un-writeable in such an embodiment—that is, the security device may have to be physically present to allow the contents of the persistent storage device to be read or written.

According to at least one embodiment, the virtualization offloading component may comprise one or more small form factor pluggable (SFP) ports. Such ports may be used to establish connectivity with the cloud computing service substrate network and/or other networks.

According to some embodiments, as mentioned earlier, the provider network of the cloud computing service may implement one or more other services, such as a database service or an object storage service, which can be accessed from at least some compute instances of the cloud computing service executing in a third-party proprietary (or open source) software environment using credentials assigned to the compute instances by an instance metadata service (IMDS) of the cloud computing service. Such an IMDS may also provide other metadata elements to compute instances executing in a third-party proprietary (or open source) software environment, including a unique identifier assigned by the cloud computing service to the compute instance, an identifier of a machine image used for the compute instance (if any), block device mappings information of the instance, and so on. In some embodiments, the metadata may be accessed from the compute instance executing in the third-party proprietary (or open source) software environment via a link-local HTTP (HyperText Transfer Protocol) address accessible only from within the instance itself. In at least one embodiment, an agent of the IMDS may be run at a virtualization offloading component, and such metadata (including the credentials usable to access other provider network services from the compute instance) may be provided by the agent.

In some embodiments, as mentioned earlier, private service endpoints (PSEs) may be set up within an IVN, e.g., to enable network traffic to flow between compute instances of the IVN and other publicly-accessible provider network services without using the public Internet. In at least one such embodiments, clients may define and associate various types of policies with such PSEs—e.g., a policy may indicate that only instances CI1, CI2 and CI3 of an IVN are permitted to use an endpoint PSE1 to access a particular storage object SO1 at a storage service SS1. Compute instances set up at third-party pre-assembled computer system included in a server with a virtualization offloading component may utilize such PSEs and associated policies in at least some embodiments.

In some embodiments, a virtualization offloading component used to manage compute instances on a third-party pre-assembled computer system executing proprietary third-party (or open source) software may provide the same elasticity, scalability, reliability, and security that is offered to clients using default fleet, non-branded compute instances. Also, a virtualization offloading component used to manage compute instances on a third-party pre-assembled computer system executing proprietary (or open source) third-party software may provide seamless access to other services of a service provider network of the cloud computing service, such as a virtual private cloud service (VPC or IVN), an elastic-block storage service (EBS), a load balancing service (LBS), etc.

Example Arrangement of Server System Including a 3$^{rd}$ Party Pre-Assembled Computer FIG. 1 illustrates a server system 102 that includes a pre-assembled computer system 104 mounted in a server chassis 106 along with a baseboard management controller (BMC) 108 that is connected to a virtualization offloading card 202 (shown in FIG. 2) included in the server chassis 106 external to the pre-assembled computer system 104, according to some embodiments.

Server system 102 includes pre-assembled computer system 104 mounted to a server chassis 106 of the server system 102 via a mounting device 128. In some embodiments, pre-assembled computer system 104 is a third-party pre-assembled computer system that is pre-installed in a computer case of the pre-assembled computer system prior to being installed in the server chassis 106. For example, pre-assembled computer system 104 may be an Apple Mac Mini, Apple Mac Pro, or other pre-assembled third-party computer system, as a few examples. In some embodiments, other pre-assembled third-party computer system may be used.

In some embodiments, a server system 102 may include multiple server chassis 106, wherein each server chassis 106 functions as a sled that slides into and out of a tray of the server system 102. In some embodiments, various types of mounting devices 128 may be used to mount a pre-assembled computer system 104 in a server chassis 106. For example, in some embodiments, a mounting device 128 may be a bracket that mounts to a computer case of the pre-assembled computer system 104 and that also mounts to the server chassis 106. For example, FIG. 1 illustrates four mounting brackets at or near the respective corners of the pre-assembled computer system 104. In other embodiments, more advanced mounting devices 128 may be used. For example in some embodiments, a mounting device 128 may comprise a molded plastic structure configured to couple to chassis 106 and couple with pre-assembled computer system 104. In some embodiments, a mounting device 128, such as a molded plastic structure, may form an air duct that directs air from fans 130 toward pre-assembled computing device 104. Additionally, in some embodiments, a mounting device 128, such as a molded plastic structure, may form an exhaust air duct that directs air from pre-assembled computer system 104 towards an exhaust portion at a front or back panel of server system 102. In some embodiments, a server system 102 may be included in a data center that operates at temperatures that are greater than temperatures in which the pre-assembled computer system 104 is typically designed to operate. In such embodiments, fans 130 and/or an inlet and exhaust air duct within the server chassis 106 may direct supplementary airflow to the pre-assembled computer system 104 to compensate for higher air temperatures in the data center.

In addition to pre-assembled computer system 104, server system 102 also includes baseboard management controller (BMC) 108 and offloading virtualization card 202 (shown in FIG. 2) coupled to one another and coupled to the server chassis 106. Additionally, server system 102 may include a power distribution board 110 and inverter 112. In some embodiments, server system 102 may also include a set of one or more solid-state drives 114 and an electro-mechanical device, such as solenoid 116 and mechanical linkage 118. Also, in some embodiments, server system 102 may include thermal sensors, such as thermal sensors 120, 122, and 124 shown in FIG. 1.

In some embodiments, a baseboard management controller, such as BMC 108, may be connected to ports of the pre-assembled computer system 104 via one or more cables coupled at first ends to connectors of the BMC and coupled at second ends to respective ports of the pre-assembled computer system 104. For example, BMC 108 includes two universal serial bus (USB) connectors coupled via respective cables to two USB ports of pre-assembled computer system 104. In some embodiments, the USB ports of the pre-assembled computer system 104 may be intended for connecting user interface devices to the pre-assembled computer system, such as a mouse, keyboard etc. Additionally, as discussed in more detail herein, the BMC 108 may be configured to emulate a keyboard and/or mouse. Additionally, BMC 108 includes a high definition multimedia interface (HDMI) connector coupled via an HDMI cable to an HDMI port of pre-assembled computer system 104. In some embodiments, the HDMI port of the BMC 108 may emulate a monitor attached to the pre-assembled computer system 104 and process video display signals transmitted from the pre-assembled computer system 104 via the HDMI port of the pre-assembled computer system 104. Also, BMC 108 includes an internal Ethernet (RJ45) connector configured to be coupled to a corresponding Ethernet port (RJ45) of the pre-assembled computer system 104. An Ethernet cable may be included in server chassis 106 and couple the Ethernet connector of the BMC 108 to the Ethernet port of the pre-assembled computer system 104. In addition, BMC 108 includes an external Ethernet connector (RJ45) 140 that extends out towards a front or back face of the server system 102.

Additionally, BMC 108 is coupled to system management components of the server system via cables or board connections (not shown). For example, BMC 108 is coupled to thermal sensors 120, 122, and 124 via one or more cables. Also, BMC 108 is coupled to fans 130, inverter 112, solid-state drives (SSDs) 114, and power distribution board 110 via one or more cables. In some embodiments, BMC 108 may receive status information or data about connected system management components, such as state information, temperature information, etc. and may remotely control system management components, such as by changing a power state of the system management components or adjusting a control parameter of the system management components, such as a fan speed.

In some embodiments, a baseboard management controller, such as BMC 108, may include PCIe interfaces such as Thunderbolt connectors (which combines PCIe and DisplayPort into two serial signals and additionally provides DC power in a single cable) or other equivalent types of PCIe interfaces. In some embodiments, the PCIe interfaces may be connected via a plurality of cables to corresponding PCIe ports of the pre-assembled computer system 104. For example, FIG. 1 shows four PCIe interface ports of pre-assembled computer system 104 coupled via cables to four corresponding PCIe interface connectors of BMC 108. In some embodiments, more or fewer PCIe connections may be used to connect a BMC to a third-party pre-assembled computer system included in a server chassis with the BMC. For example, in some embodiments, only two PCIe connections may be used to connect pre-assembled computer system 104 to BMC 108 and a third PCIe interface port of the pre-assembled computer system 104 may be connected to an external PCIe interface port mounted on a front or back panel of the server system 102. In some embodiments, not all of the PCIe interface ports of the pre-assembled computer system 104 may be used. For example, in some embodiments, two PCIe interface ports may be connected to a BMC 108, one PCIe interface port may be connected to an external PCIe interface connector on a front or back panel of the server system 102, and one PCIe interface port may be left unused. In some embodiments, a BMC 108 may further include PCIe controllers, such as Thunderbolt controllers, that multiplex or de-multiplex PCIe signals transmitted via the PCIe interfaces of the BMC 108. For example, in some embodiments, BMC 108 may include Thunderbolt controllers, such as those designed by Intel Corp. that correspond with respective Thunderbolt connectors of an Apple branded computer, such as a Mac Mini.

Figure 2:
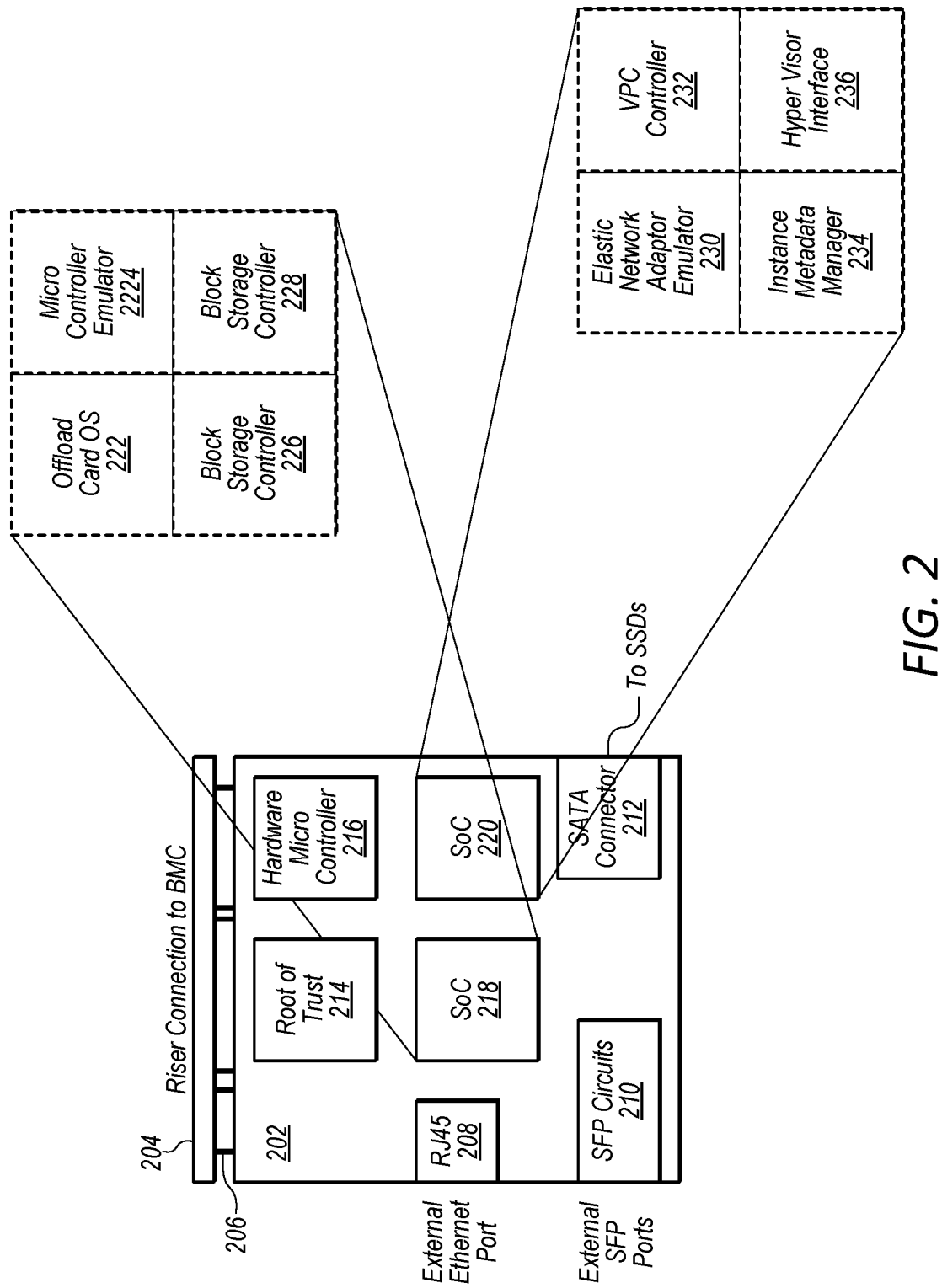
FIG. 2 illustrates an example virtualization offloading component and example processes running on processors of the virtualization offloading component, according to some embodiments.

In some embodiments, a baseboard management controller, such as BMC 108, may include a riser connection 126 that couples with a riser board (e.g. riser board 204 as shown in FIG. 2) that in turn couples with a corresponding riser connection of a virtualization offloading card. In some embodiments, a virtualization offloading card may be positioned above a BMC at a second level within the server chassis 106, wherein the BMC is at a first level within the server chassis. In some embodiments, the BMC and the virtualization offloading card may be oriented as two planes approximately parallel to one another, with one located above the other in the server chassis. In some embodiments, a riser board may connect orthogonally to a BMC board such that the riser board rises above the BMC board. Additionally, the riser board may make a right angle connection with a virtualization offloading card, such that the virtualization offloading card extends out at a right angle from the riser board and above the BMC board.

In some embodiments, PCIe interfaces of a BMC 108 and a riser connection 126 between a BMC 108 and a virtualization offloading card 202, such as the PCIe interface ports and connectors shown in FIG. 1, may be used to effectively extend a PCIe bus of the pre-assembled computer system 104 outside of a case of the pre-assembled computer system 104 and allow the BMC 108 and/or a virtualization offloading card 202 to access the PCIe bus, as described in more detail below.

In some embodiments, a server system 102 may further include an external power button 130 that operates mechanical linkage 118 to cause cam 132 to press power button 134 of pre-assembled computer system 104. Alternatively solenoid 116 may actuate to cause cam 132 to press power button 134, independent of external power button 130 and mechanical linkage 118.

In some embodiments, BMC 108 may further include an external BMC power button 136 that allows the BMC power to be cycled by pressing the external BMC power button 136.

Also, in some embodiments, a virtualization offloading card 202 may be connected to SSDs 114 via a SATA cable connected to SATA connector(s) 138 coupled to SSDs 114. In some embodiments, a BMC 108 may emulate a peripheral device attached to pre-assembled computer system 104 and cause the pre-assembled computer system 104 to boot a compute instance (e.g. virtual machine) using a machine image stored in SSDs 114. In some embodiments, a client of a cloud computing service may provide client selected machine images to be used to boot a compute instance on pre-assembled computer system 104 and the client selected machine images may be stored in SSDs 114 for use in booting a compute instance on pre-assembled computer system 104.

In some embodiments, a client of a cloud computing service may access compute instances instantiated on a pre-assembled computer system 104 as virtual desktop instances in the cloud that operate in a proprietary (or open source) software environment, such as in a Mac OS software environment. For example, pre-assembled computer system 104 and virtualization offloading card 202 may support a virtual desktop infrastructure (VDI) and a client may use the compute instance as a virtual network client (VNC) to remotely share a screen of the virtual desktop using a VNC for graphical interface. In some embodiments, a particular port of the pre-assembled computer system may be dedicated as a VNC graphical interface. Also, a client of a cloud computing service may access compute instances instantiated on a pre-assembled computer system 104 as a server using a secure shell (SSH) protocol. For example, a client may be provided a key-pair at time of launch and may use the key-pair to log into the compute instance using a SSH protocol. In some embodiments, a particular port of the pre-assembled computer system 104 may be dedicated for SSH use.

In some embodiments, a baseboard management controller, such as BMC 108, may be configured to receive request messages from a virtualization offloading card 202 or from a cloud computing service, wherein the request messages are formatted as intelligent platform management interface (IPMI) messages. The use of IPMI formatted messages may allow a common control system that also controls other non-branded fleet virtual hosts to also control the branded-fleet virtual hosts, such as that are included in server system 102. In some embodiments, BMC 108 may be configured to take appropriate control actions in response to receiving an IPMI request message, such as cycling a power state of a system management component, adjusting a fan speed, changing a power state of the pre-assembled computer system 104, etc. In some embodiments, a BMC 108 in conjunction with virtualization offloading card 202 may implement reboot migration of compute instances, wherein an instance residing on an underlying host that is to be rebooted, such as a pre-assembled computer system 104, is migrated to a different underlying host prior to the re-booting. This may prevent interruption of the compute instance from the client's perspective.

FIG. 2 illustrates an example virtualization offloading card 202 and example processes running on processors of the virtualization offloading card, according to some embodiments.

In some embodiments, the BMC 108 in combination with the virtualization offloading card 202 may function as a bridge between the pre-assembled computer system 104 and a cloud computing service. For example, visualization off-loading card 202 may be a PCIe connected device (e.g. via Thunderbolt 3) and a USB connected device (e.g. via USB 3) which connects an unmodified third-party pre-assembled computer system 104, such as a Mac Mini, to a substrate network of a cloud computing service. Also, the virtualization offloading card 202 may provide control interfaces between the cloud computing service and the virtualization host (e.g. the third-party pre-assembled computer system 104, (e.g. an un-modified Mac-Mini)). The virtualization offloading card 202 may present non-volatile memory express (NVMe) and elastic network adaptors (ENA) over PCIe connections, such as via Thunderbolt connectors and controllers, and HID Keyboard and CDC ACM (e.g. a communications data class abstract control model protocol) over USB 3 to the third-party pre-assembled computer system (e.g. Mac Mini). Additionally, the BMC 108 may have an external general purpose input/output (GPIO) control port that can be attached to a compatible power control module to toggle power to the third-party pre-assembled computer system 104. The BMC 108 in conjunction with the virtualization offloading card 202 may enable network control of the third-party pre-assembled computer system 104 included in the server chassis 106 of the server system 102 without requiring direct human interaction.

Virtualization offloading card 202 includes connectors 206 that connect virtualization offloading card 202 to riser board 204 (which may be same riser board to which the BMC 108 is connected via riser connection 126). In some embodiments, connectors 206 may include connectors for power and multi-pin connectors that extend PCIe communications to the virtualization offloading card 202 from the BMC 108. In some embodiments, other types of connectors may be used. For example, in some embodiments, connectors 206 may include a power connector, a 140 position edge connector and another 168 position edge connector configured to couple with corresponding connectors of the riser board 204. In addition, virtualization offloading card 202 includes external Ethernet (RJ45) connector 208 and small form-factor port (SFP) and circuitry 210. Additionally, as discussed above, virtualization offloading card 202 includes a SATA connector 212 to connect the virtualization offloading card 202 to SSDs 114. Additionally, virtualization off-loading card 202 includes root of trust component 214, hardware microcontroller 216 and systems on a chip (SoCs) 218 and 220.

In some embodiments, a pre-assembled computer system, such as pre-assembled computer system 104, shown in FIG. 1 may include its own root of trust that acts as an additional layer of trust in addition to the root of trust component 214 of virtualization offloading card 202. For example, an Apple Mac Mini or Mac Pro may include a T2 security chip that functions as an additional root of trust component for the Apple Mac Mini or Mac Pro in addition to the root of trust component 214. In some embodiments, the root of trust component 214 may guarantee the virtualization offloading card 202 and the BMC 108 are booted from trusted firmware. In some embodiments, a root of trust component 214 may ensure that the SoCs 218 and 220 are booted using trusted firmware. Additionally, in some embodiments, root of trust component 214 may store keys or other encryption-related data used to ensure secure communications between components of virtualization offloading card 202 and BMC 108. Because virtualization offloading card 202 is implemented on a separate physical piece of hardware from pre-assembled computer system 104, the operator of the cloud computing service may have greater control over security features of the virtualized offloading card 202 and may better restrict access to service management components implemented via the virtualization offloading card 202.

The virtualization offloading card 202 may include one or more processors/cores 218/220 as well as one or more memories (not shown). The term "virtualization offloading" may be used to describe a virtualization offloading card 202 because much of the work required to configure and manage compute instances running at pre-assembled computer system 104 may be offloaded to a virtualization offloading card 202, enabling a larger fraction of the computing and other resources of the pre-assembled computer system 104 to be utilized for the compute instances and client applications running at the compute instances. In the embodiment depicted in FIG. 2, code and data of a number of virtualization management component programs (e.g., software and/or firmware) may be stored locally on memory of the virtualization offloading card 202 or at SSDs 114 connected via SATA connector 112. The code and data may be run using the processors/cores 218/220. In at least some embodiments, individual ones of the virtualization management components may be executed using respective subsets of the available cores/processors—e.g., one of the cores may be used for an embedded operating system, another for a network interface card emulator, and so on. For example, FIG. 2 illustrates SoC 218 running offload card OS 222, micro controller emulator 224, and two instances of block storage controller 226 and 228. Also, FIG. 2 illustrates SoC 220 running elastic network adaptor emulator 230, isolated virtual network/virtual private cloud controller 232, instance metadata manager 234, and hypervisor interface 236.

At least a portion of the code resident in the memories of the virtualization offloading card 202 and SSDs 114 may be used to manage various aspects of networking and storage for compute instances launched at the pre-assembled computer system 104, and may therefore be referred to as a combination of a networking manager and a storage manager. Note that at least in some embodiments, at least a portion of the code and/or data may be dynamically updated or modified, e.g., after one or more compute instances have been launched at the pre-assembled computer system 104 using the code and data.

External Ethernet port 208 of virtualization offloading card 202 may connect RJ45 circuitry of virtualization offloading card 202 to a system management processor 302 (e.g., a baseboard management controller of BMC 108). The system management processor 302, may be responsible for tasks such as monitoring the physical state of the pre-assembled computer system 104, providing results of such monitoring, rebooting/restarting of the pre-assembled computer system 104 when needed, and so on. Small form-factor circuitry 210, linked to one or more SFP ports, may be used to access a substrate network of a cloud computing service in at least some embodiments.

One or more types of local persistent storage devices may be incorporated within the virtualized offloading component 202 and/or BMC 108 in some embodiments, such as NVME (non-volatile memory express) device(s), other (non-NVME) solid state drives (SSDs) 114 accessible from SATA (Serial Advanced Technology Attachment) circuitry of the virtualization offloading card(s) 202, and so on. In at least some embodiments, storage manager code running at the virtualization offloading card 202 may use the local persistent storage devices 114 to configure root volumes and/or other logical storage devices for compute instances instantiated at the pre-assembled computer system 104. In some embodiments, the storage manager code may implement block-level device interfaces locally (in effect implementing a subset of the functionality of a block storage service). In other embodiments, the storage manager may access a block storage service (and/or other network-accessible storage services) of the provider network to configure at least some storage devices.

FIG. 3 illustrates example elements of a baseboard management controller (BMC) 108 that may be included in a server system 102 with a pre-assembled computer system 104, according to some embodiments.

BMC 108 comprises BMC system management processor 302, multiple PCIe controllers 304 (e.g. such as Thunderbolt controllers as described herein), trusted platform module 306, BMC volatile memory 308, and BMC flash memory 310. Additionally, BMC 108 includes embedded multimedia controller 312, along with offload card remote controllers 316 and 318. In some embodiments, offload card remote controller 1 (314) may permit or inhibit system communications between the BMC system management processor 302 and system management components, such as thermal sensors 120, 122, 124, fans 130, inverter 112, power distribution board 110, etc. For example, if the virtualization offloading card 202 cannot verify a trusted relationship with a system management component the virtualization offloading card 202 may inhibit communication flow between the system control component and the BMC system management processor 302. Additionally, offload card remote controller 2 (316) may inhibit or permit commands from the BMC 108 directed to system control components, such as a power source for the virtualization offloading card 202, a power source for the PCIe controllers 304, a power source for the BMC flash memory 310, a power source for the BMC volatile memory 308, the inverter 112, a power source for the pre-assembled computer system 104, etc. In some embodiments control commands from BMC system management processor 302 to a solenoid that actuates to change a power state of pre-assembled computer system 104 may pass through offload card remote controller 3 (318). In some embodiments, in addition to permitting or inhibiting outgoing commands from BMC system management processor 302, a virtualization offloading component, via offload card remote controller 2 (316), may independently send control commands to system control components of a server system 102. A virtualization offloading card and a virtualization offloading component may be used interchangeably herein to refer to a card such as shown in FIG. 2, as an example.

In some embodiments, offload card remote controller 1 (314), offload card remote controller 2 (316), and offload card remote controller 3 (318) may be implemented on a single physical chip, such as a single complex programmable logic device (CPLD) or field programmable gate array (FPGA), or other suitable hardware component.

Additionally, BMC 108 includes front panel BMC power button 320 and external Ethernet port 322. Also as previously discussed in regard to FIG. 1, BMC 108 includes Ethernet port 324 that couples, via an Ethernet cable, with a corresponding Ethernet port of pre-assembled computer system 104. Additionally, BMC 108 includes PCIe interfaces, such as PCIe interface connectors 326, 328, 330, and 332 that couple, via cables, with corresponding PCIe interface ports of pre-assembled computer system 104. In some embodiments, other suitable PCIe type connectors may be used. Also, BMC 108 includes HDMI port 336 that couples, via an HDMI cable, to a corresponding HDMI port of pre-assembled computer system 104. Additionally, BMC 108 includes USB connectors 336 and 338 that couple, via USB cables, to corresponding USB ports of pre-assembled computer system 104.

In some embodiments, a BMC 108 may include fewer PCIe controllers, such as fewer PCIe controllers 304 than shown in FIG. 3. For example, in some embodiments, a BMC 108 may include a single PCIe controller, such as a single PCIe controller 304 per SoC included in virtualization offloading card 202. In some embodiments, one PCIe interface port of pre-assembled computer system 104 may be routed, via a cable, to a PCIe interface (USB-type 3) connector mounted on a panel of a server system, such as USB connector 606 or USB connector 622 illustrated in FIG. 6. In some embodiments, multiple PCIe controllers and connections may be associated with a single SoC of virtualization offloading card 202. For example, in some embodiments, each of SoCs 218 and 220 may be connected to two PCIe controllers 304.

In some embodiments, a BMC 108 may allow for remote access to functions of a Mac Mini that require direct user input such as a start-up assistant or software update process. In some embodiments, BMC system management processor 302 may emulate key strokes on a keyboard, mouse clicks via a mouse, etc. to remotely control an attached pre-assembled computer system 104, such as an Apple Mac Mini. For example, currently Apple operating systems will not allow a set up assistant to be operated remotely. Thus, a BMC 108 may emulate a user interacting with a startup assistant by emulating keystrokes and mouse clicks.

In some embodiments, a BMC 108 in conjunction with a virtualization offloading card 202 may verify that software/firmware is from a trusted source before allowing the software/firmware to be installed on a pre-assembled computer system 104. Additionally, trusted platform module 306 may ensure that the BMC system manager processor 302 is booted from a trusted source of software/firmware.

While not shown, BMC 108 may additionally include universal asynchronous receiver/transmitter (UART) connections to the virtualization offloading card 202 and may monitor conditions of the virtualization offloading card 202.
Example Management Components that May be Included in a Virtualization Offloading Card FIG. 4 illustrates example virtualization management software components which may be executed at a virtualization offloading card 202 included in a server system 102 with a pre-assembled computer system 104, according to some embodiments. The set of virtualization management software components 402 run at the virtualization offloading card 202 cores/processors (e.g. SoCs 218/220), which may include an embedded operating system 404 (which may orchestrate the operations of the various hardware elements of the virtualization offloading card 202 itself), one or more network interface card (NIC) emulators 406 as well as one or more emulators 408 for legacy devices.

Block-device storage managers 410 run at the virtualization offloading card 202 may, for example, configure root volumes for compute instances run on a third-party pre-assembled computer system 104 using a local persistent storage server system, such as SSDs 114. NVME device emulators 412 may be used to manage accesses to NVME-based persistent storage in some embodiments. IVN data plane connectivity managers 414 may, for example, implement operations of the encapsulation protocol (such as encapsulating outbound packets, or de-capsulating inbound packets) used for traffic between compute instances of the pre-assembled computer system 104 and other endpoints. Such other endpoints may include, for example, other compute instances within provider network data centers, services other than the cloud computing service, and so on. Calls to a VPC mapping service similar to the mapping service 1045 of FIG. 10 may be initiated from the IVN data plane connectivity managers 414. In some embodiments, the IVN data plane connectivity managers may initiate or implement configuration operations to assign network addresses within an IVN to one or more virtual network interfaces that are programmatically attached to a compute instance running at the third-party pre-assembled computer system 104, thus including the compute instance within the network address range designated for the IVN by a client.

Instance metadata service agents 416 may provide various elements of metadata in response to queries issued from a compute instance launched at the pre-assembled computer system 104 in some embodiments. Such metadata may, for example, include credentials for authorizing/validating requests sent to other provider network services from the compute instance, block device mappings information of the compute instance, an identifier of the compute instance, and so on. In some embodiments, a link-local HTTP address accessible only from within the instance itself may be used to obtain the metadata at the compute instance.

In at least some embodiments, one or more agents 418 of the CCS control plane may run at the virtualization offloading card 202. Such agents may be responsible for receiving commands generated at the CCS control plane, for example, and initiating operations (e.g., configuration change operations) at the virtualization offloading card 202 and/or the pre-assembled computer system 104 in response to such commands.

In at least one embodiment, one or more networks security agents 420 may be run at the virtualization offloading card 202. Such network security agents may be responsible for a number of operations, such as causing log records to be generated for various kinds of traffic (including DNS requests and responses, as well as standard IP packets) directed to or from a compute instance at the pre-assembled computer system 104, initiating or performing intrusion detection or exfiltration detection operations, and the like. It is noted that in some embodiments, a different combination of software and/or firmware components may be run at the virtualization offloading card 202 than that shown by way of example in FIG. 4.

Figure 5:
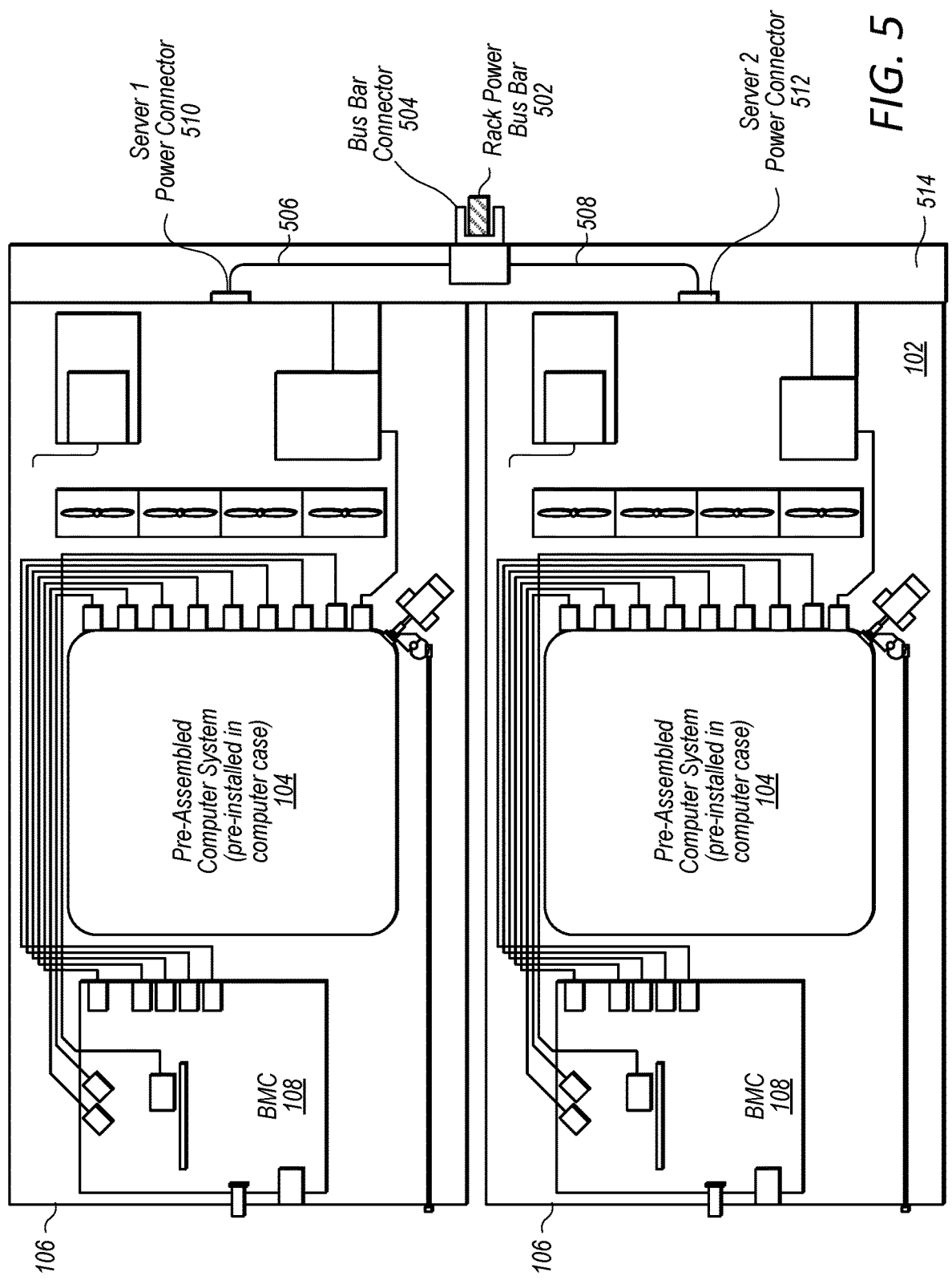
FIG. 5 illustrates an example tray comprising two server chassis with pre-assembled computer systems mounted within the two server chassis and power connections for the tray and the two server chassis, according to some embodiments.

FIG. 5 illustrates an example tray 514 comprising two server chassis 106 with pre-assembled computer systems 104 mounted within the two server chassis 106 and power connections for the tray and the two server chassis 106, according to some embodiments.

In some embodiments, a server system 102 may be a 1U size server that fits into a 1U slot of a standard EIA 19" rack (Electronic Industries Alliance standard rack). In some embodiments, each server chassis 106 may have a width that is approximately half the width of a standard 1U slot. In some embodiments, a server chassis 106 may function as a sled that slides on a tray 514 of a server system.

In some embodiments, a server system 102 may include a power bus bar connector 504 that couples with a direct current (DC) power bus bar 502 of a rack in which the server system 102 is mounted. In some embodiments, a server system 102 may include power lines or busses 506 and 508 that connect bus bar connector 504 to respective server sled power connectors 510 and 512. In some embodiments server sled power connectors 510 and 512 may be blind-mate style connectors that allow a connection to be performed when a corresponding blind-mate power connector attached to a respective one of server chassis 106 is slid into tray 514 and pressed into place against sled power connector 510 or 512. In some embodiments, power distribution boards included in server chassis 106 may supply DC power to BMC 108, virtualization offloading card 202, and other system components, while an inverter 112 may convert DC power received from DC power bus 502 into alternating current (AC) power to be supplied to pre-assembled computer system 104.

Figure 6:
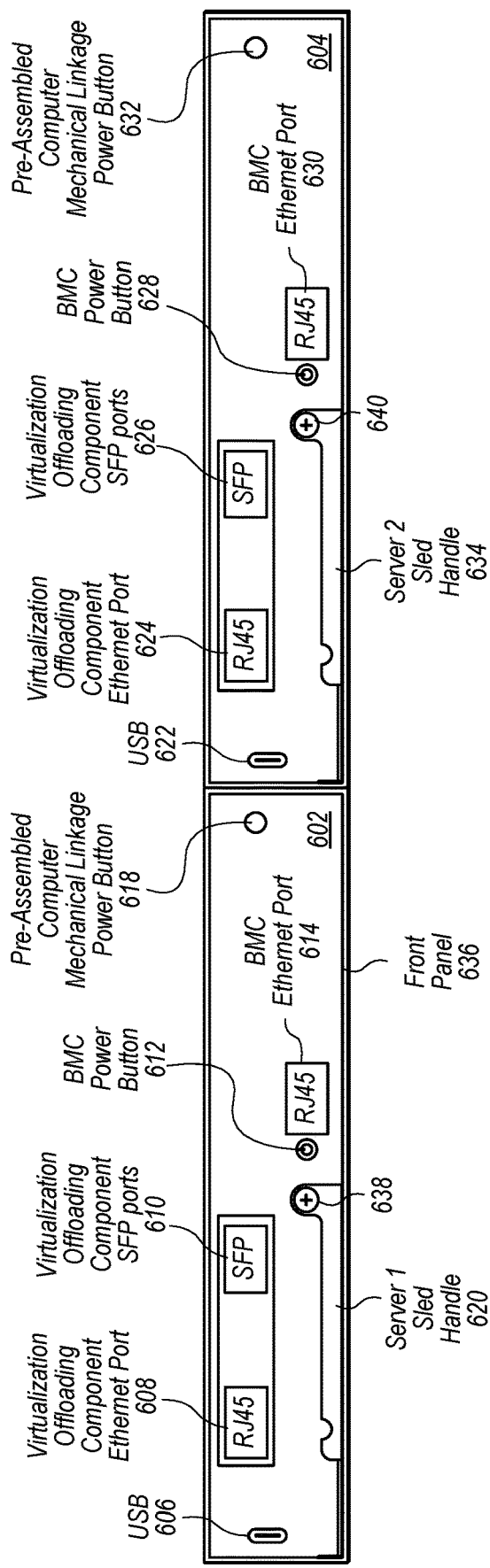
FIG. 6 illustrates an example front panel of a two-server system, wherein each server chassis includes a pre-assembled computer system mounted in a respective server chassis, according to some embodiments.

FIG. 6 illustrates an example front panel 636 of a server system 102, wherein each server chassis 106 includes a pre-assembled computer system 104 mounted in a respective server chassis 106, according to some embodiments.

As discussed above in regard to FIG. 5, in some embodiments, multiple server chassis 106 may operate as sleds mounted on a tray 514 of a server system 102. As shown in FIG. 6, in some embodiments a front panel 636 may include server sleds handles, such as server sled handles 620 and 634. The server sled handles may fold out away from the front panel 636 to allow a server chassis 106 to be pulled into and out of tray 514. Also, when fully positioned within server system 102, server chassis 106 may be secured by coupling the front panel of the server chassis to respective server handles via screws 638 or 640.

As previously discussed in some embodiments, a PCIe interface port (or other PCIe interface) of a pre-assembled computer system 104 may be coupled to an interface device of a front panel 636. For example USB-3 connectors 606 and 622 are mounted at front panels 636 and may be connected to PCIe interface ports of respective pre-assembled computer systems 104 included in the chassis 106. Also, a front panel 636 may include virtualization offloading card 202 connections via an Ethernet port 608 (624) and a small form factor port (SFP) 610 (626). Additionally, a front panel 636 may include BMC Ethernet port 614 (630) and a power button 612 (628) for the BMC. Additionally, a front panel 636 may include a power button 618 (632) connected to a mechanical linkage of an electro-mechanical device that causes a power button of a pre-assembled computer system 104 to be pressed.

Figure 7:
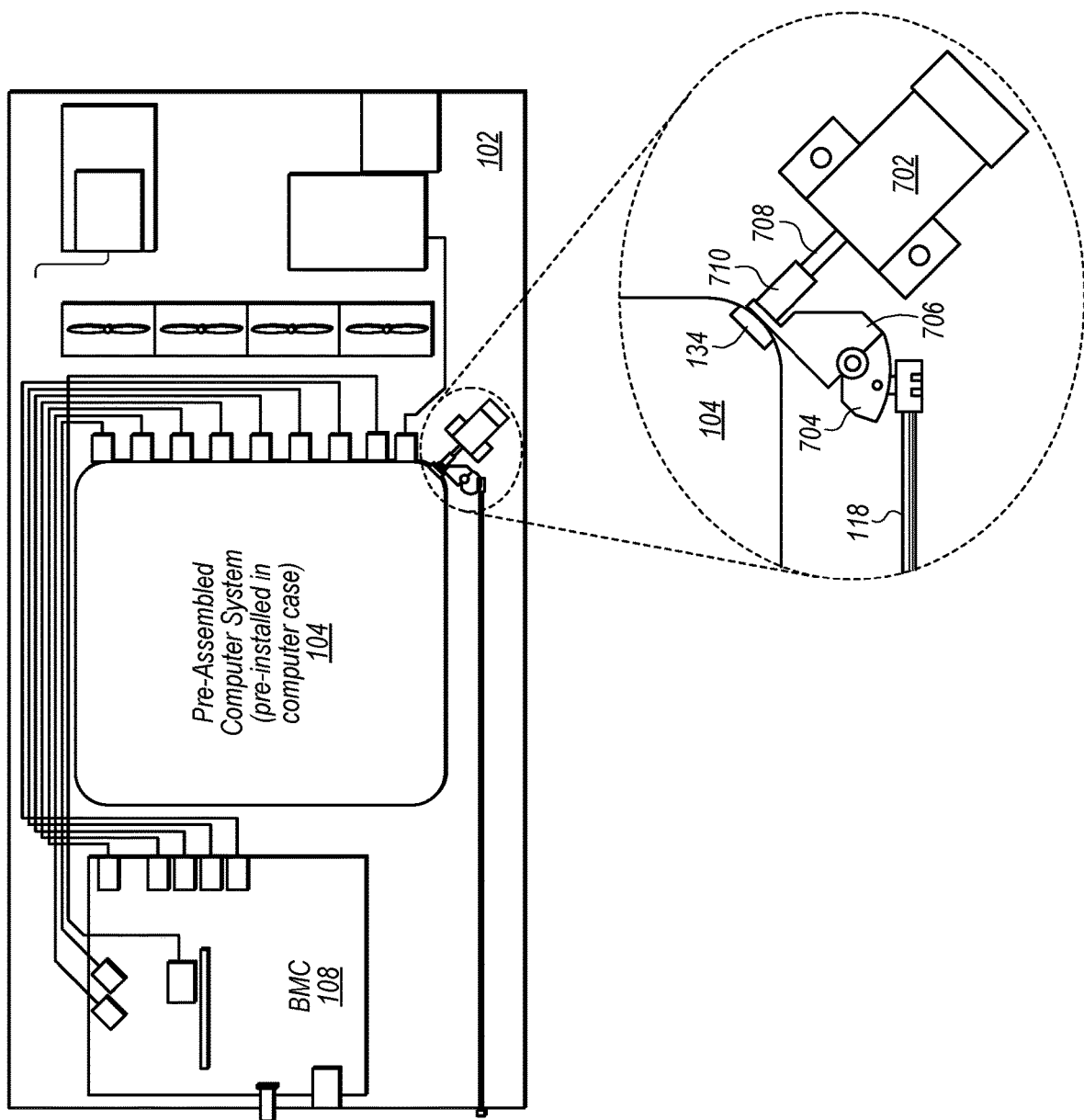
FIG. 7 illustrates a more detailed view of a mechanical linkage and electro-mechanical device for remotely pressing a power button of a pre-assembled computer system mounted in a server chassis, according to some embodiments.

FIG. 7 illustrates a more detailed view of a mechanical linkage and electro-mechanical device for remotely pressing a power button of a pre-assembled computer system mounted in a server chassis, according to some embodiments.

In some embodiments, an electro-mechanical device includes a solenoid 702 and a cam 132, wherein the cam 132 includes two cam pieces 704 and 706. Additionally, the solenoid 702 may include a shaft 708 and end piece 710 configured to impact cam piece 706 when solenoid 702 is extended.

In some embodiments, a two-piece cam 132 may allow for independent operation of mechanical linkage 118 and independent operation of solenoid 702. For example, actuation of solenoid 702 may cause end piece 710 to impact cam piece 706 and push cam piece 706 toward power button 134 of pre-assembled computer system 104. However, cam piece 706 may pivot on a hinge of cam 132 such that a gap is opened up between cam piece 706 and cam piece 704. Thus, cam piece 704 which is connected to mechanical linkage 118 may not cause mechanical linkage 118 to move when solenoid 702 is actuated to press power button 134.

Likewise, end piece 710 of solenoid 702 is not rigidly connected to cam piece 706 such that when mechanical linkage 118 is pressed, cam piece 704 moves towards cam piece 706 and closes a gap between the two cam pieces. The two cam pieces (704 and 706) then move together to impact power button 134. This movement opens up a gap between cam piece 706 and end piece 710 of solenoid 702, such that shaft 708 of solenoid 702 is not drawn to move with the cam when the cam is operated via mechanical linkage 118.

In some embodiments, a baseboard management controller, such as BMC 108, may control solenoid 702. In some embodiments, the BMC 108 may cause solenoid 702 to press power button 134 according to different timing sequences. In some embodiments, a first timing sequence may include pressing a power button a single time for a first amount of time (e.g. a first duration) and a second timing sequence may include pressing the power button for a second amount of time that is different than the first amount of time (e.g. a second duration). Also, in some embodiments, a first timing sequence may include pressing the power button multiple times in a particular pattern of press duration and non-press durations. In some embodiments, a second timing sequence may include a different sequence of presses and non-presses that differs from the first time sequence. In some embodiments, multiple press/non-press sequences and press durations may correspond to different functions of the pre-assembled computer system. Also different request messages received or generated by the BMC 108 may correspond to different button press timing sequences than invoke the different functions of the pre-assembled computer system.

For example, in some embodiments, a brief press of power button 134 may cause an Apple computer, such as a Mac Mini, to enter a prepare for shutdown mode, wherein a prompt is presented on a display connected to the Apple computer (or an emulated display) that asks whether the user would like to shut down. A longer duration press of power button 134 may cause the pre-assembled computer system 104 to enter a hard power down sequence, wherein power is cut regardless of whether applications are still running. In some embodiments, removing power from the pre-assembled computer system 104 via a power cable and then applying power via the power cable while holding down the power button 134 may cause the pre-assembled computer system to enter a special mode, such as a firmware update mode. In some embodiments, a BMC 108 may cause an inverter or power distribution board to cut power to pre-assembled computer system 104 and then apply power while causing solenoid 702 to press power button 134. This power button press timing sequence may cause the pre-assembled computer system 104 to enter a special mode, such as a firmware update mode or a boot from external drive mode. In some embodiments, other power button press timing sequences may be performed by a solenoid 702 controlled by BMC 108.

Figure 8:
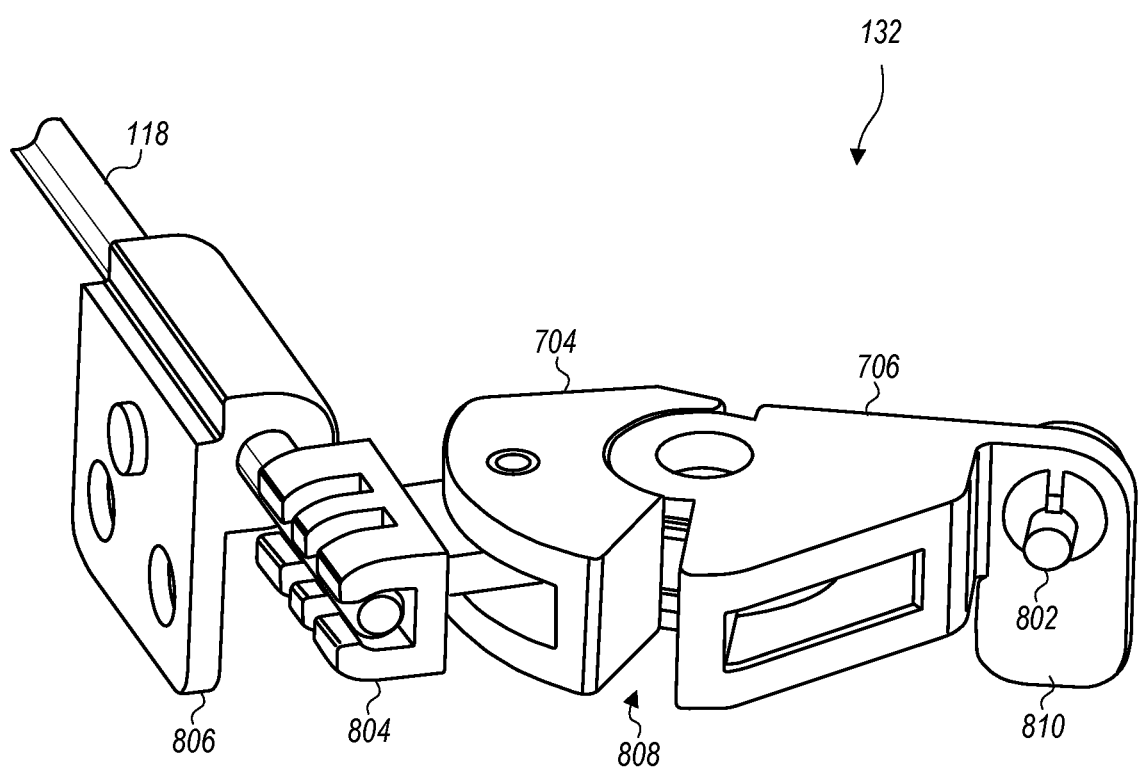
FIG. 8 is a more detailed view of a two-piece cam mechanism that is included with an electro-mechanical device to remotely press a power button of a pre-assembled computer system included in a server chassis, according to some embodiments.

FIG. 8 is a more detailed view of a two-piece cam mechanism that is included with an electro-mechanical device to remotely press a power button of a pre-assembled computer system included in a server chassis, according to some embodiments.

As can be seen in FIG. 8, a gap 808 may exist between cam piece 704 and cam piece 706. Mechanical linkage 118 may be guided, when pressed external to the chassis, by guide 806 and may be connected to cam piece 704 via bracket 804. Movement of mechanical linkage 118 may cause gap 808 to close such that cam piece 704 impacts cam piece 706 and makes both cam piece 704 and 706 move together to cause nob 802 of impact plate 810 to press a power button of a pre-assembled computer system. Note that the backside of nob 802 is visible in FIG. 8 where the front side of nob 802 impacts the power button. Alternatively, a solenoid 702 may be actuated such that the end piece 710 at the end of shaft 708 of the solenoid impacts the lower portion of impact plate 710 to cause nob 802 to press a power button.

Note the two-piece cam 132 is configured to impact a power button that is located on a rounded corner of a pre-assembled computer system, such as a power button of an Apple Mac Mini. For example, the two-piece cam 132 is configured to impact the power button in a direction orthogonal to a tangent line of the rounded corner, but is not mounted in the server chassis in a position orthogonal to the front, back, top, or bottom sides of the pre-assembled computer system.

Figure 9:
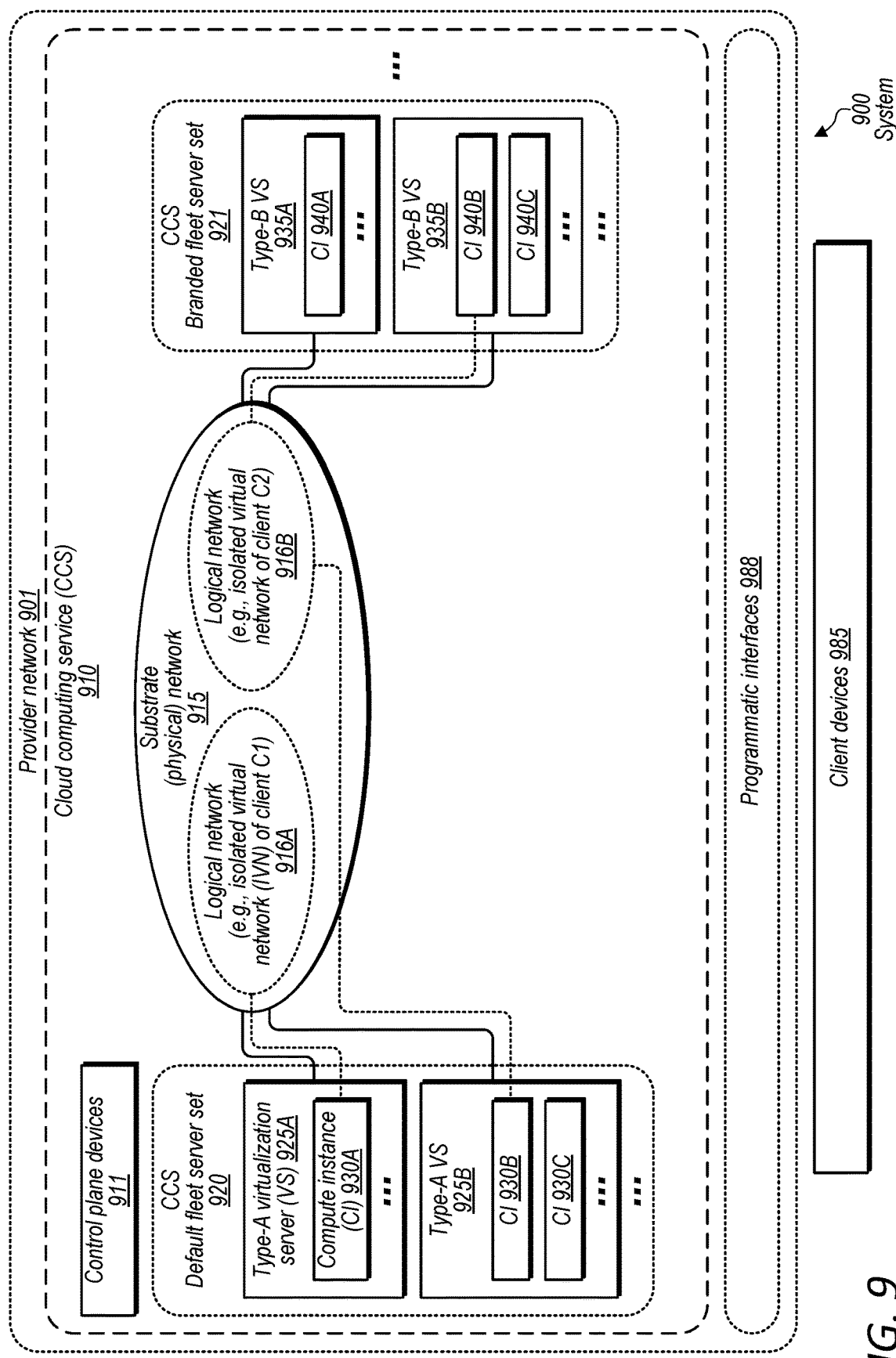
FIG. 9 illustrates an example system environment in which servers comprising pre-assembled computer systems are connected to a substrate physical network of a cloud computing service and are enabled to instantiate compute instances at the pre-assembled computer systems, according to some embodiments.

Example System Environment Including Both Default Fleet and Branded Fleet Servers FIG. 9 illustrates an example system environment in which servers comprising pre-assembled third-party computer systems are connected to a substrate physical network of a cloud computing service and are enabled to instantiate compute instances at the pre-assembled third-party computer systems, according to some embodiments.

As shown, system 900 includes resources and artifacts of a cloud computing service (CCS) 910 of a provider network 901. Networks set up by an entity such as a company or a public sector organization to provide one or more network-accessible services (such as various types of cloud-based computing, storage or analytics services) accessible via the Internet and/or other networks to a distributed set of clients may be termed provider networks in some embodiments. A provider network may sometimes be referred to as a "public cloud" environment. The resources of a provider network may in some cases be distributed across multiple data centers, which in turn may be distributed among numerous geographical regions (e.g., with each region corresponding to one or more cities, states or countries).

The CCS 910 may implement one or more programmatic interfaces 988 which can be used by clients to submit programmatic requests from client devices 985 (such as laptops, desktops, mobile computing devices etc.), including for example requests to launch, terminate, or reconfigure compute instances 930 and 940 such as virtual machines, bare metal instances and the like. A bare metal instance may access at least some un-virtualized hardware components of the virtualization server at which the bare metal instance is run. Programmatic interfaces 988 may include, for example, one or more web-based consoles, command-line tools, graphical user interfaces, APIs, and the like. The requests submitted by CCS clients may be directed to a set of control plane devices 911 of the CCS, which may in turn cause corresponding internal requests or commands to be implemented at various other components of the CCS. The control plane of the CCS may be responsible primarily for administrative or configuration tasks, while the data plane (which may include the compute instances 930 run at default fleet virtualization servers 920 as well as compute instances run at branded fleet virtualization servers 921) may be used primarily for client applications and data.

In the embodiment depicted in FIG. 9, a variety of hardware servers may be used to set up compute instances 930 on behalf of CCS clients. The operator of the CCS 910 may, for example, set up racks containing standardized servers of various categories at one or more data centers, such as default fleet server set 920 and branded fleet server set 921. Compute instances (CIs) of various categories, such as CIs 930A, 930B, 930C, 940A, 940B, or 940C may be launched at default fleet or branded fleet servers in response to client requests submitted to the control plane. Just as the underlying virtualization servers may differ in capabilities from CCS set 920 to set 921, the compute instances launched at the servers of the different sets may also differ in capabilities—e.g., CIs "A" may be optimized for compute-intensive applications, while CIs "B and C" may be optimized for storage-intensive tasks. In some embodiments, a CCS may use only a single type of virtualization server by default and only a single type of branded server by default.

The CCS 910 may comprise a physical network 915, to which virtualization servers may be connected in the depicted embodiment. Using the substrate network 915 as the physical infrastructure, a set of logical networks may be configured, such as 916A or 916B. Examples of logical networks may include isolated virtual networks (IVNs) established on behalf of CCS clients in at least some embodiments—for example logical network 916A may comprise an IVN of a client C1, while logical network 916B may comprise an IVN of a client C2 in the scenario depicted in FIG. 9. The compute instances 930 and 940 may be assigned network addresses of the logical networks in at least some embodiments. Thus, for example, CI 930A of virtualization server (VS) 925A may be configured within logical network 916A, while CI 940B of VS 935B may be configured within logical network 916B. To manage and route the network traffic directed to or from entities (such as compute instances 930 or 940) of the logical networks using the underlying substrate network to which the virtualization hosts are connected, a mapping service and/or an encapsulation protocol may be employed at the CCS 910, as discussed in further detail below with respect to FIG. 10.

In some embodiments a virtualization offloading component included in a branded fleet server, such as server 935A or 935B may incorporate hardware, firmware and/or software components in some embodiments that perform networking and storage virtualization tasks required to establish compute instances (e.g., instances 940), while acting as a secure intermediary between the servers and the substrate network 915.

According to at least some embodiments, a virtualization offloading card 202 included in branded fleet server 935 may include program instructions that when executed at the virtualization offloading card 202's processors or cores implement one or more networking managers and one or more storage managers. In some embodiments, a given virtualization offloading card 202 may establish connectivity, e.g., using respective connectors or cables, with (a) the CCS substrate network 915, and (b) a system management service processor (e.g., a baseboard management controller or BMC 108) of a branded fleet server. In one example implementation, connectivity to the substrate network may be established using an Ethernet cable (e.g., inserted into a small form-factor port (SFP) of the virtualization offloading card 202), connectivity to a PCIe interface port of a pre-assembled computer system 104 may be established using PCIe or USB, and connectivity to the system management service processor of the BMC 108 may be established using an RJ45 connector and/or a riser connection. Other types of ports, cables and/or connectors may be used in other embodiments. After the virtualization offloading card 202 detects that these two types of connectivity have been established successfully, in at least some embodiments, the virtualization offloading card 202 may cause the control plane devices 911 of the CCS to present the branded fleet server 935 as a virtualization host selectable by the client to run compute instance(s). In some embodiments, the branded fleet server may be presented as a dedicated virtualization host at which only a single client's compute instances may be set up. In some embodiments, a given CCS client C1 may permit other CCS clients to set up compute instances at a branded fleet server.

After the branded fleet server has been designated and presented as a virtualization host, various types of compute instance configuration operations (such as operations to launch or terminate a compute instance or change configuration settings of the instance) may be performed at the server in the depicted embodiment, e.g., in response to requests submitted by clients via interfaces 988. A compute instance may be configured within a logical network (such as an IVN) with the help of operations performed at networking managers running at the virtualization offloading card 202, for example.

The storage managers running at the virtualization offloading card 202 may configure and provide access to a root volume for a compute instance 940, and/or to other logical storage devices, file systems and the like. In at least one embodiment, such root volumes and/or other logical storage devices may be configured using persistent storage devices (such as NVME devices) incorporated within the server chassis enclosure. The networking managers of the virtualization offloading cards 202 may include, for example, NIC emulators, IVN connectivity managers and the like in some embodiments. The virtualization offloading cards 202 may also include physical security devices in some embodiments, such as physical keys that render the storage devices of the server system unusable if the physical keys are removed from the virtualization offloading cards 202.

Various types of functionality supported for compute instances 930 or 940, such as the ability to log network traffic flows (including DNS requests and responses), the ability to perform intrusion detection and other types of security-related operations, and so on, may be supported transparently for compute instances 930 and 940 in at least some embodiments. Instance metadata, e.g., including credentials that enable a compute instance 930 or 940 to make authorized service requests to other services of the provider network 910, may be generated at a virtualization offloading cards 202 and provided to the compute instance in some embodiments. Metrics (e.g., including resource utilization levels, network packet counts/drops etc.) may be collected for the compute instances launched at client-selected servers and provided to clients.

Example Mapping and Encapsulation of Network Traffic for Logical Networks

Figure 10:
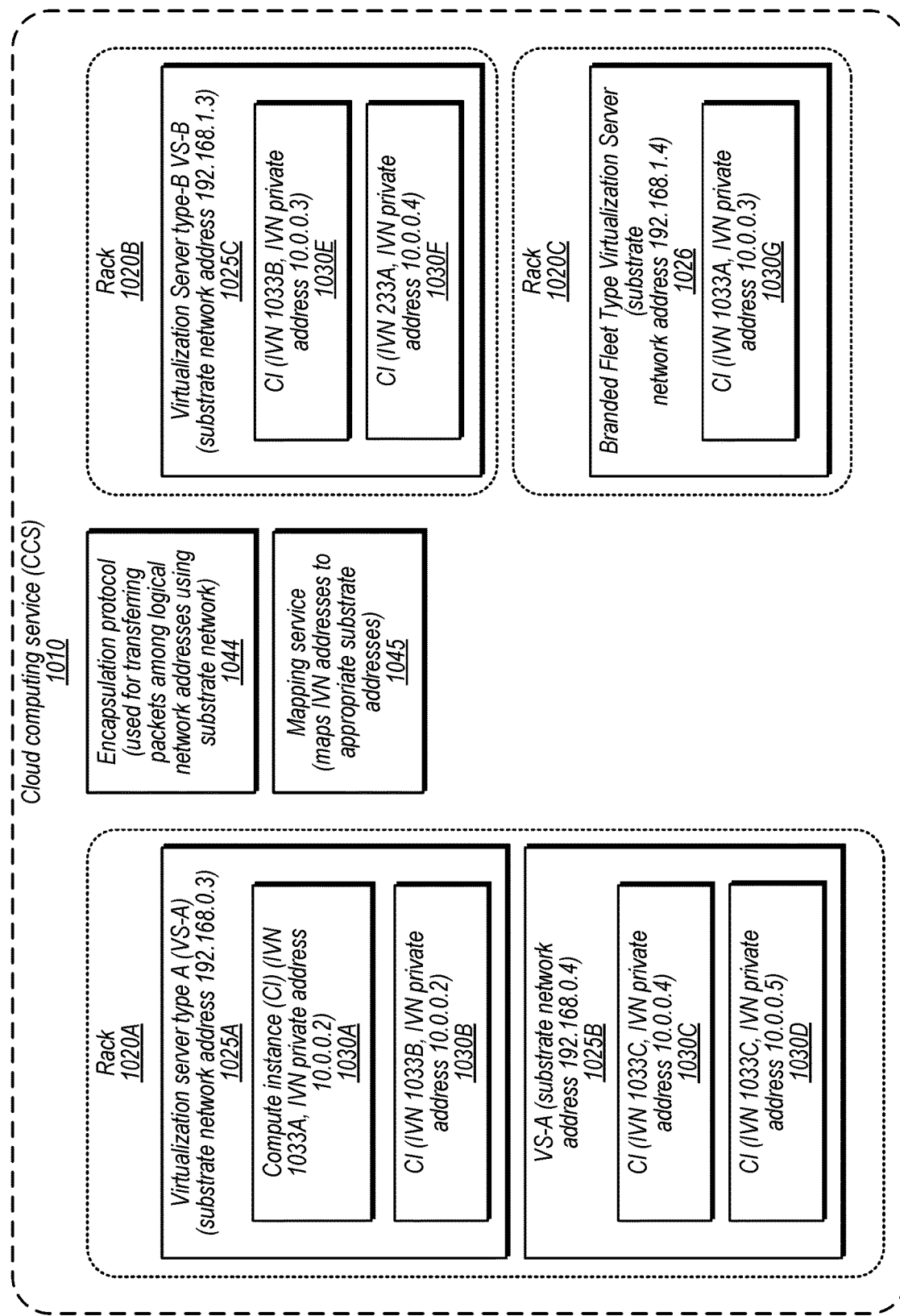
FIG. 10 illustrates an example of the use of a mapping service and an encapsulation protocol at a cloud computing service at which logical networks are configured over a substrate network that includes the pre-assembled computer systems, according to some embodiments.

FIG. 10 illustrates an example of the use of a mapping service and an encapsulation protocol at a cloud computing service at which logical networks are configured over a substrate network that includes the pre-assembled computer systems, according to some embodiments.

As mentioned earlier, in various embodiments a CCS may include logical networks configured using an underlying physical or substrate network, and a virtualization offloading card 202 may be connected to such a substrate network to enable network communications of compute instances set up at branded fleet servers.

The depicted scenario is presented to illustrate the kinds of networking-related operations that may have to be performed to enable traffic flows between compute instances set up within such logical networks; such operations are not restricted to environments in which a virtualization offloading card 202 is used. IP (Internet Protocol) version 4 addresses are used by way of example in FIG. 10, although addresses formatted in accordance with other protocols such as IPv6 may be used in at least some embodiments. Note that the specific IP addresses shown in FIG. 10 are chosen as examples, and the virtualization offloading component-based techniques described herein are not limited to any specific addresses or address ranges.

In the depicted embodiment, three server racks 1020A, 1020B and 1020C are shown, each comprising one or more virtualization servers used by the CCS 1010. Rack 1020A comprises virtualization server (VS) 1025A and VS 1025B, rack 1020B comprises VS 1025C and rack 1020C comprises a branded fleet virtualization server 1026 connected via virtualization offloading cards 202. Virtualization offloading cards 202 may provide functionality and features similar to virtualization offloading cards 202 discussed in the context of FIG. 9 and elsewhere herein.

Each of the virtualization servers 1025A, 1025B, 1025C and 1026 may be assigned a substrate network address in the depicted embodiment, such as 192.168.0.3 for VS 1025A, 192.168.0.4 for VS 1025B, 192.168.1.3 for VS 1025C, and 192.168.1.4 for branded fleet server 1026. The substrate address for branded fleet server 1026 may be obtained, e.g., from the CCS control plane, by the virtualization offloading card 202 included in the branded fleet server 1026, in some embodiments.

Compute instances launched at the virtualization servers may be assigned network addresses within isolated virtual networks in the depicted embodiment. For example, CIs 1030A (at VS 1025A), 1030F (at VS 1025C), and 1030G (at VS 1026) may all be configured within the same IVN 1033A, and assigned respective IVN private addresses 10.0.0.2, 10.0.0.4, and 10.0.0.3 respectively. Similarly, CIs 1030B and 1030E may be assigned IVN private addresses 10.0.0.2 and 10.0.0.3 within IVN 1033B, and CIs 1030C and 1030D may be assigned IVN private addresses 10.0.0.4 and 10.0.0.6 within IVN 1033C in the depicted example. Note that as indicated earlier, address ranges used within IVNs for private addresses assigned to the CIs may overlap with one another—thus, CIs 1030A and 1030B have the same private address 10.0.0.2 within distinct IVNs (1033A and 1033B). The within-IVN addresses may be deemed to be private in that they are not advertised or made accessible outside the IVNs, at least by default, in some embodiments. In at least some embodiments, the private addresses may be assigned to virtual network interfaces, and the virtual network interfaces may be programmatically attached or associated to the compute instances. In at least some embodiments, in contrast, at least some of the substrate addresses may be assigned to physical network interface cards or NICs (or to NIC emulators), e.g., at the virtualization offloading components 202.

In order to transmit network packets that originate at one CI to another CI, three types of network information may have to be considered in the depicted embodiment: the IVN private addresses of the source and destination, the IVNs to which the sources and destinations belong, and the substrate addresses of the underlying virtualization servers. For example, a packet originating at CI 1030A and destined for CI 1030G may indicate its source (private) address as 10.0.0.2 and its destination address as 10.0.0.3. However, the packet may actually have to be transferred from substrate network address 192.168.0.3 to substrate network address 192.168.1.4 to reach its intended destination. An encapsulation protocol 1044 (which is used to envelop or encapsulate packets associated with logical network sources/destinations within larger "augmented" packets associated with substrate network sources/destinations) and an associated mapping service 1045 of the CCS may be used to accomplish this type of transfer in the depicted embodiment. Networking virtualization management components of the CCS (including the networking managers running at the virtualization offloading components 202, as well as networking managers running in the virtualization management hardware/software stacks of the VSs 1025) may implement the encapsulation and de-capsulation operations of the protocol, and utilize the mapping service 1045 to determine the specific substrate address to which the packets included in such transfers should be sent.

In the above example where a packet is being sent from CI 1030A to CI 1030G, the mapping service 1045 may indicate to a networking manager associated with VS 1025A that for IVN 1033A, the destination private address 10.0.0.3 corresponds to the substrate address 192.168.1.4. The networking manager associated with VS 1025A may generate an encapsulation packet which includes the original packet within it, has a substrate source address of 192.168.0.3, a substrate destination address of 192.168.1.4, and identifies the IVN 1033A as the IVN within which the packet is being transferred. At the receiving end, a networking manager running at the virtualization offloading card 202 may extract (de-capsulate) the original packet from the encapsulation packet, and provide it to the destination CI 1030G. In some embodiments, to ensure that the packet is from a trusted/valid source, the virtualization offloading card 202 may consult the mapping service to perform a reverse mapping (e.g., to identify the origin of the packet) before extracting the original packet. The mapping service 1045 may thus provide security by preventing the opening of packets that are not validated. For packets being transmitted in the reverse direction, the virtualization offloading card 202's networking manager(s) may consult the mapping service to obtain the right substrate address for the destination, and perform the required encapsulation operation.

Figure 11:
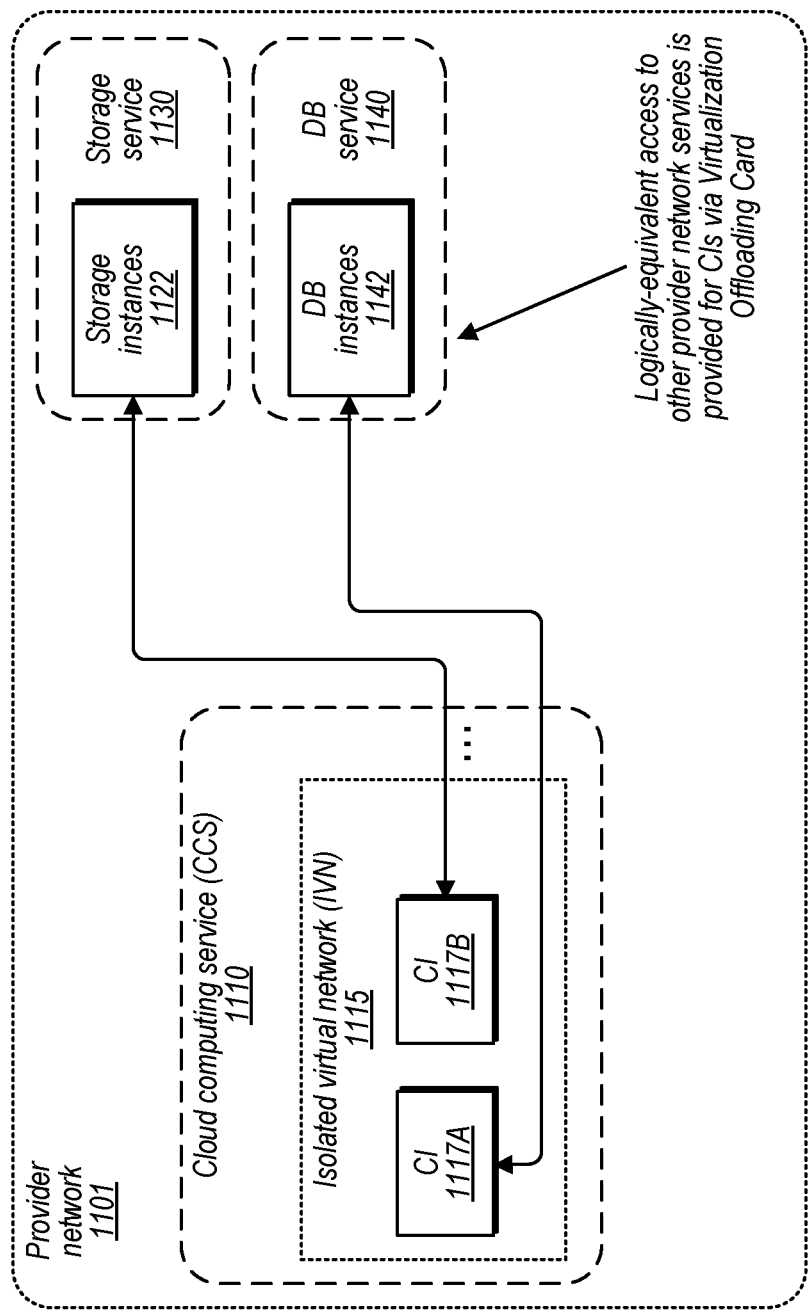
FIG. 11 illustrates an example of the use of additional provider network services by compute instances instantiated on the pre-assembled computer systems, according to some embodiments.

Example Use of Provider Network Services Via Virtualization Offloading Components FIG. 11 illustrates an example of the use of additional provider network services by compute instances instantiated on the pre-assembled computer systems, according to some embodiments.

In some embodiments, a provider network at which a cloud computing service is implemented may also provide access to other higher-level network-accessible services that utilize CCS compute instances as building blocks—for example, an instance of a database may be implemented using a compute instance of the CCS, and offered for use by clients of a network-accessible database service.

In the depicted embodiment, provider network 1101 comprises at least a cloud computing service (CCS) (similar in functionality and features to CCS 910 of FIG. 9), a storage service 1130, and a database service 1140.

In the example scenario depicted in FIG. 11, an isolated virtual network (IVN) 1115 of the kind discussed earlier has been established for a CCS client. IVN 1115 comprises a plurality of compute instances (such as CIs 1117A and 1117B) within the CCS 1110. Programs running at any of the CIs may utilize resources of other provider network services in the depicted embodiment. For example, storage instances 1122 of storage service 1130 may be accessed from CI 1117B in the provider network; similarly, database instances 1142 of database service 1140 may be accessed from CI 1117A within the provider network. In some embodiments, a virtualization offloading card included in branded fleet servers instantiated compute instance 1117A or 1117B may manage communications with storage instances 1122 or database instances 1142, in some embodiments.

Figure 12:
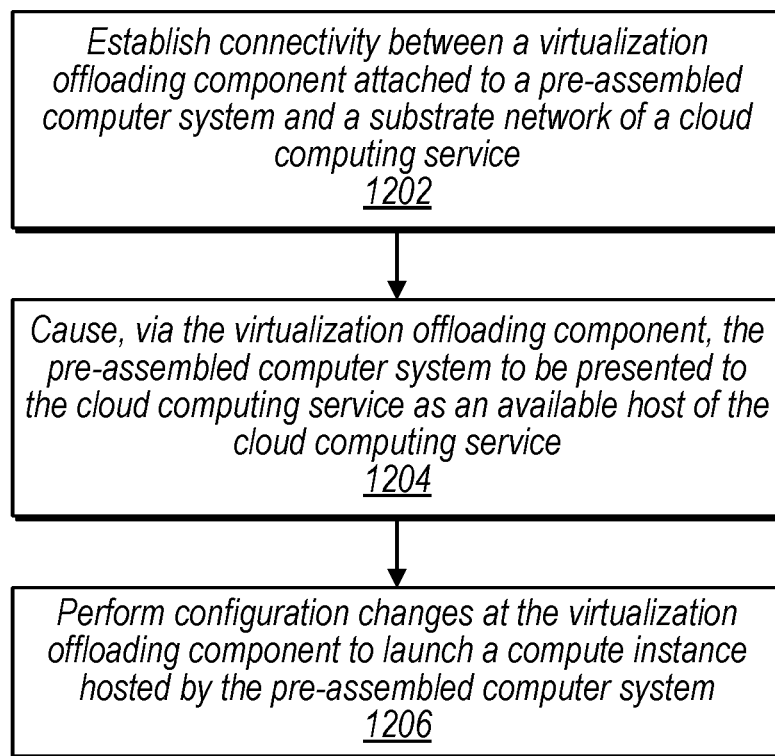
FIG. 12 is a flow diagram illustrating operations performed by a virtualization offloading component to launch a compute instance on a pre-assembled computer system included in a server chassis with the virtualization offloading component, according to some embodiments.

Example Processes for Launching and Running a Compute Instance on a Pre-Assembled 3$^{rd}$ Party Computer FIG. 12 is a flow diagram illustrating operations performed by a virtualization offloading component to launch a compute instance on a pre-assembled computer system included in a server chassis with the virtualization offloading component, according to some embodiments.

At 1202, a virtualization offloading component establishes connectivity between the virtualization offloading component and a substrate network of a cloud computing service, wherein the virtualization offloading component is included in a server chassis along with a pre-assembled computer system and is connected to the pre-assembled computer system via one or more cables as described in FIGS. 1-3.

At 1204, the virtualization offloading component causes the pre-assembled computer system included in the server chassis with the virtualization offloading component to be presented to a cloud computing service as an available virtualization host.

At 1206, the virtualization offloading component performs one or more configuration changes, such as described in FIGS. 4 and 9-11, to launch a compute instance at the pre-assembled computer system included in the server chassis with the virtualization offloading component, manage connections between the launched compute instance and other services of the provider network, manage communications for the compute instance, etc.

Figure 13:
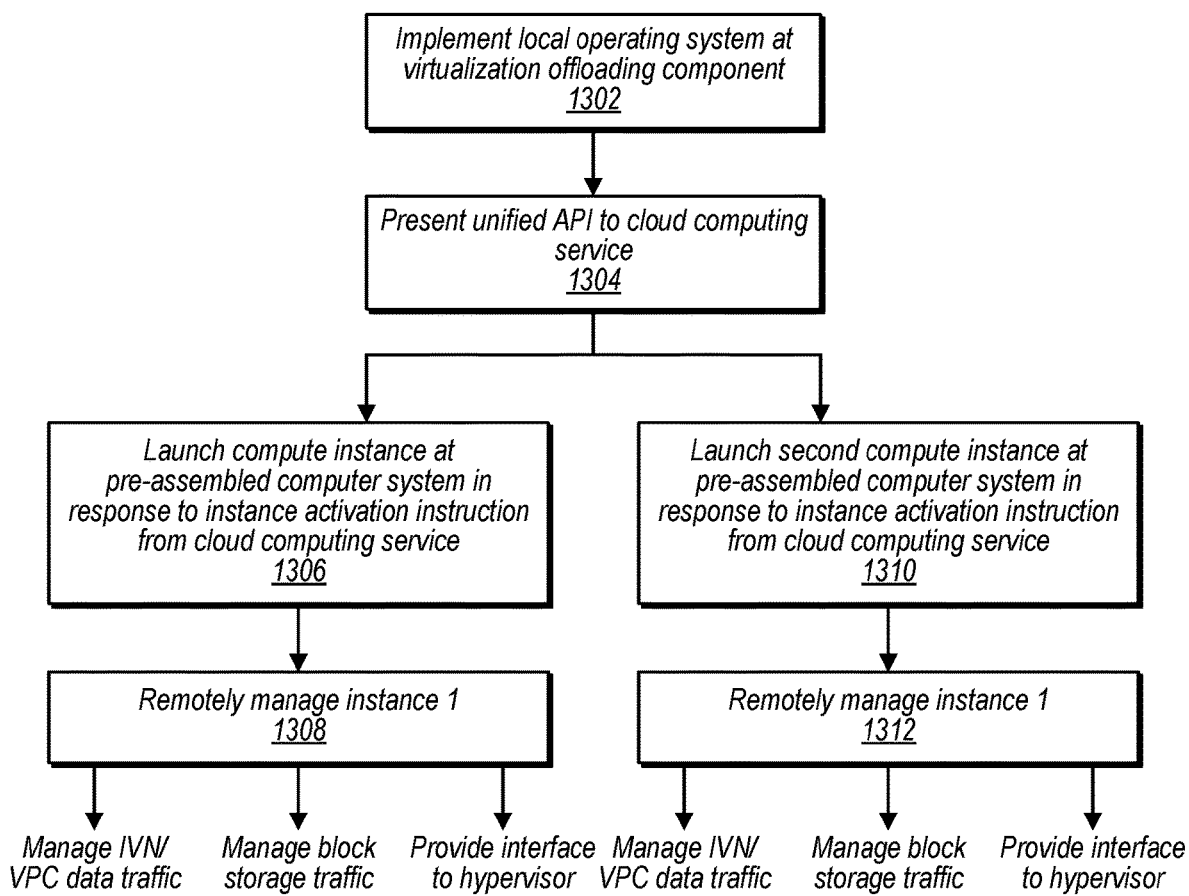
FIG. 13 is a flow diagram illustrating additional operations that may be performed by a virtualization offloading component to launch and manage a compute instance on a pre-assembled computer system included in a server chassis with the virtualization offloading component, according to some embodiments.

FIG. 13 is a flow diagram illustrating additional operations that may be performed by a virtualization offloading component to launch and manage a compute instance on a pre-assembled computer system included in a server chassis with the virtualization offloading component, according to some embodiments.

At 1302, the virtualization offloading component implements a local operating system at on the cores (e.g. SoCs) of the virtualization offloading component. At 1304, the virtualization offloading component presents a unified API interface to the cloud computing service to manage launching compute instances at a pre-assembled computer system included in a server chassis with the virtualization offloading component.

At 1306, the virtualization offloading component launches a first compute instance at the pre-assembled computer system in response to receiving an instance activation instruction via the API presented at 1304. Also, at 1310 the virtualization offloading component launches a second compute instance at the pre-assembled computer system in response to receiving an instance activation instruction via the API presented at 1304.

At 1308 and 1312 the virtualization offloading component simultaneously manages the first in second compute instances, which may include managing isolated virtual network/virtual private client mappings, managing I/O to a block storage service, providing an interface to a hypervisor to report utilization levels, etc. In some embodiments, managing the first and second compute instances may further include performing other tasks as described herein, such as executing any of the various management components described in regard to FIG. 4, as an example.

Figure 14:
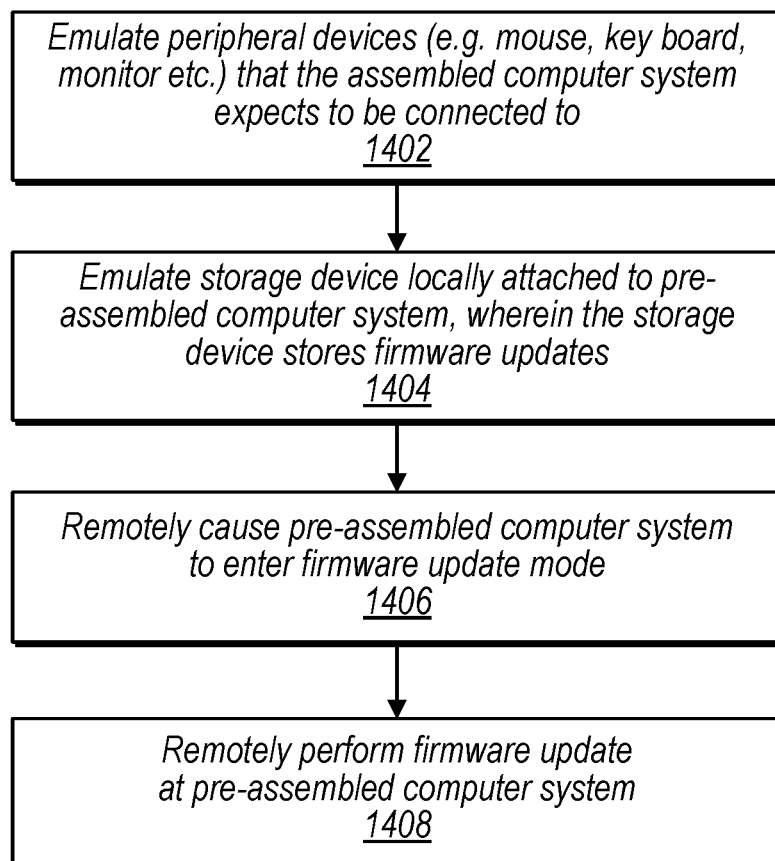
FIG. 14 is a flow diagram illustrating operations that may be performed by a baseboard management controller (BMC) to execute a firmware update of a pre-assembled computer system included in a server chassis with the BMC, according to some embodiments.

Example Processes for Remotely Controlling a 3$^{rd}$ Party Pre-Assembled Computer System FIG. 14 is a flow diagram illustrating operations that may be performed by a baseboard management controller (BMC) to execute a firmware update of a pre-assembled computer system included in a server chassis with the BMC, according to some embodiments.

At 1402, the BMC emulates peripheral devices, such as a mouse, keyboard, monitor, etc. such that the pre-assembled computer system believes that it is connected to such peripheral devices.

At 1404, the BMC emulates a storage device locally attached to the pre-assembled computer system, wherein the emulated storage device stores software updates or firmware updates for the pre-assembled computer system.

At 1406, the BMC remotely causes the pre-assembled computer system to enter a software update mode or a firmware update mode. For example, the BMC may cause the pre-assembled computer system to enter a firmware update mode by pressing a power button of the pre-assembled computer system according to a button press sequence indicating a firmware update is to be performed. As another example, the BMC may cause the pre-assembled computer system to enter a software update mode my emulating keystrokes or mouse clicks that trigger a software update to be performed.

At 1408, the BMC causes the pre-assembled computer system mounted in the server chassis in a rack of a data center to remotely perform a software update or firmware update without requiring human intervention to execute the software update or the firmware update.

Figure 15:
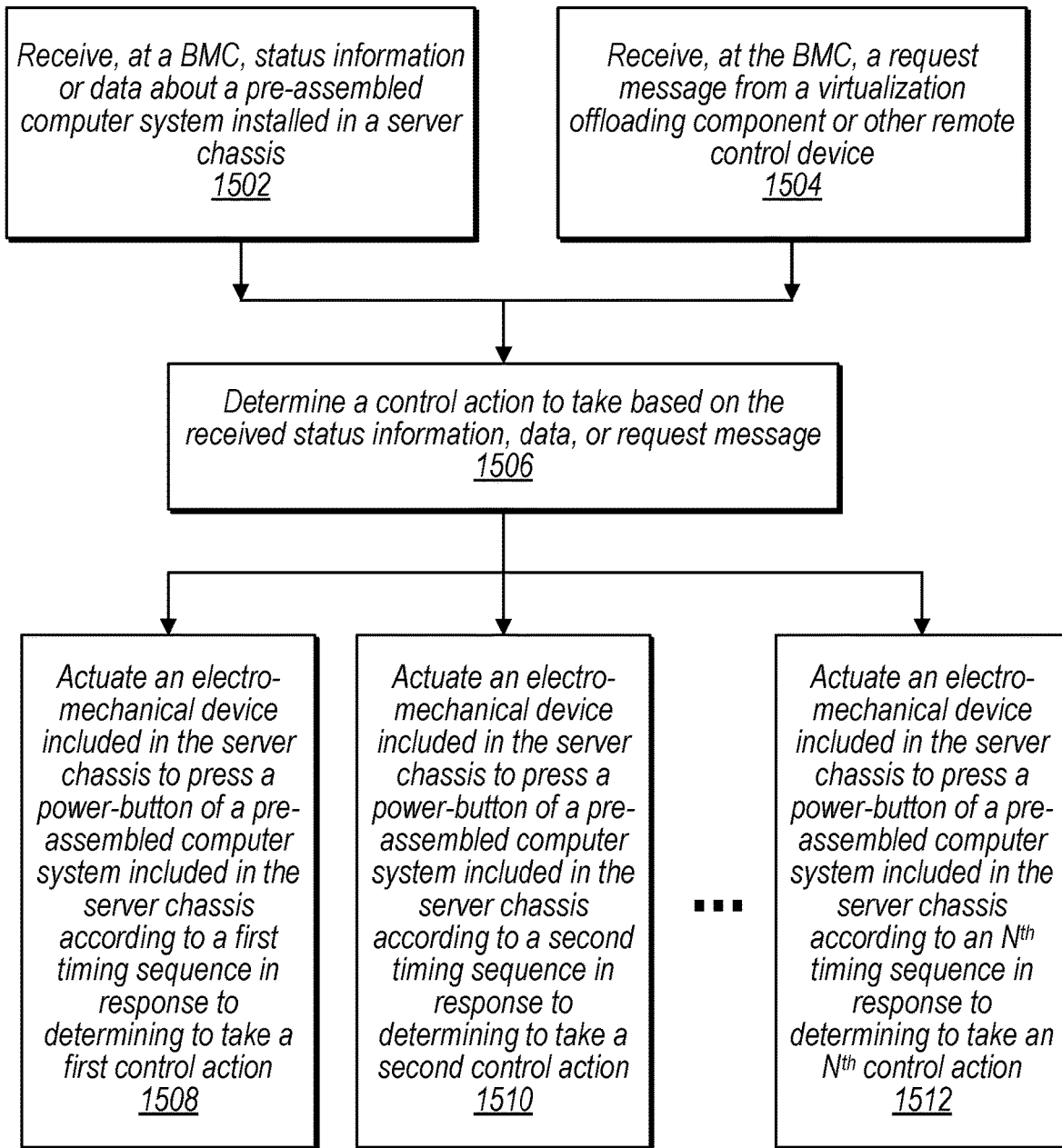
FIG. 15 is a flow diagram illustrating operations that may be performed by a baseboard management controller (BMC) to manage a power-state of a pre-assembled computer system included in a server chassis with the BMC, according to some embodiments.

FIG. 15 is a flow diagram illustrating operations that may be performed by a baseboard management controller (BMC) to manage a power-state of a pre-assembled computer system included in a server chassis with the BMC, according to some embodiments.

At 1502 a BMC receives status information or data about a pre-assembled computer system installed in a server chassis with the BMC. For example, the BMC may receive state information about the pre-assembled computer system, operating information such as power usage, temperature, etc. Also the BMC may receive status information from other system management components that indicate a status of the pre-assembled computer system. For example, a virtualization offloading component may send status information indicating that the pre-assembled computer system in unresponsive. Additionally or alternatively, at 1504, the BMC may receive a request message from the virtualization offloading component instructing the BMC to take one or more control actions in regard to the pre-assembled computer system. In some embodiments, a request message from another remote device, such as cloud compute service control plane, may be received at the BMC via the virtualization offloading component. In some embodiments, the request message may be formatted according to a standard management protocol, such as an intelligent platform management interface (IPMI) protocol.

At 1506, the BMC determines one or more control actions to take based on the received status information, data, and/or request message. In some embodiments, various control actions may be taken. For example, at 1508, the BMC may cause an electro-mechanical device to press a power button of the pre-assembled computer system according to a first timing sequence as a first type of control action. Also, at 1510 and 1512 the BMC may cause the electro-mechanical device to press the power button according to other timing sequences, as alternative control actions that may be taken. In some embodiments, the control actions taken may relate to performing a software update or firmware update as described in FIG. 14 and may not require pressing the power button. In some embodiments, other control actions may be taken.

Illustrative Computer System

Figure 16:
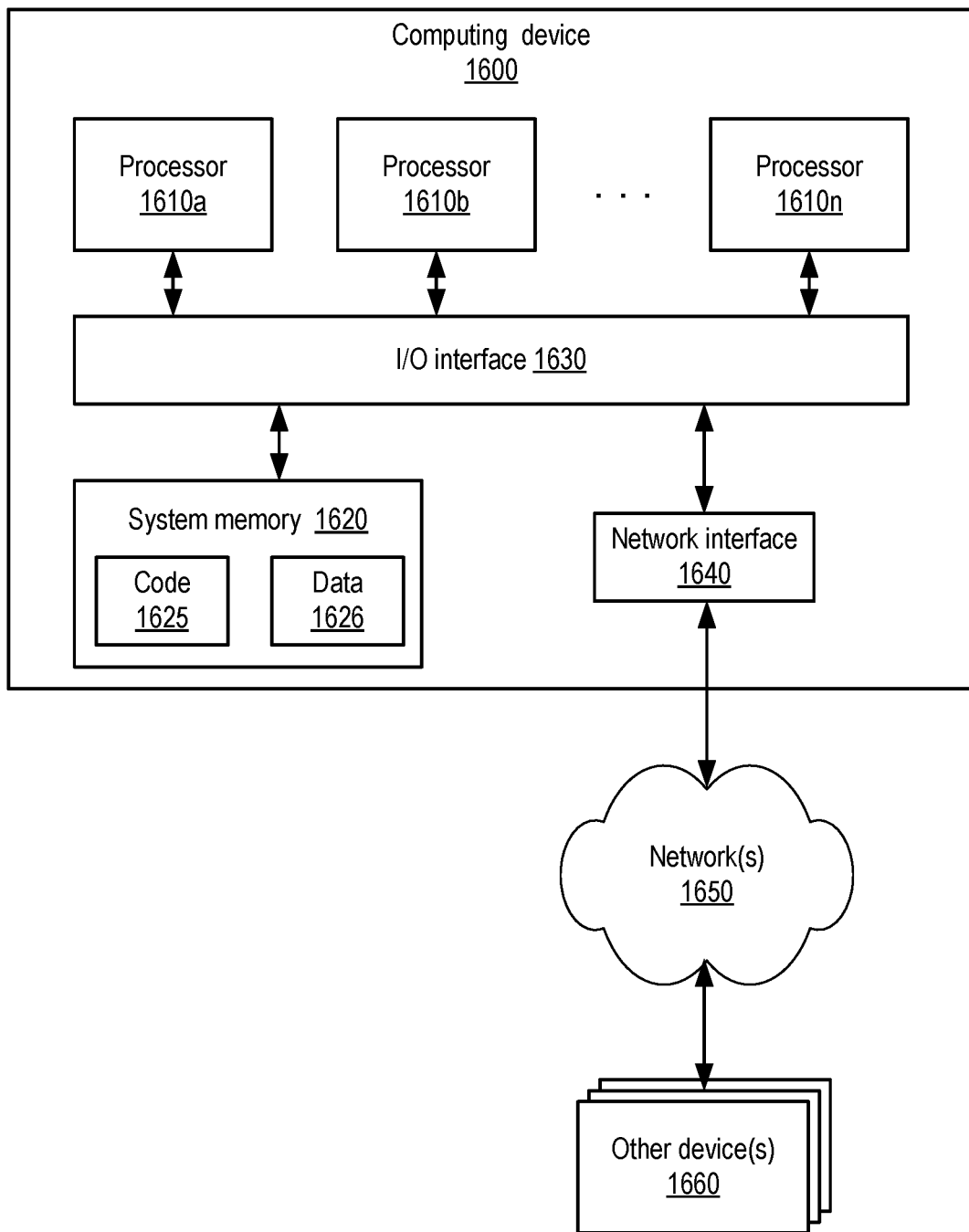
FIG. 16 is a block diagram illustrating an example computing device that may be used in at least some embodiments.

FIG. 16 is a block diagram illustrating an example computing device that may be used in at least some embodiments.

FIG. 16 illustrates such a general-purpose computing device 1600 as may be used in any of the embodiments described herein. In the illustrated embodiment, computing device 1600 includes one or more processors 1610 coupled to a system memory 1620 (which may comprise both non-volatile and volatile memory modules) via an input/output (I/O) interface 1630. Computing device 1600 further includes a network interface 1640 coupled to I/O interface 1630.

In various embodiments, computing device 1600 may be a uniprocessor system including one processor 1610, or a multiprocessor system including several processors 1610 (e.g., two, four, eight, or another suitable number). Processors 1610 may be any suitable processors capable of executing instructions. For example, in various embodiments, processors 1610 may be general-purpose or embedded processors implementing any of a variety of instruction set architectures (ISAs), such as the x86, PowerPC, SPARC, or MIPS ISAs, or any other suitable ISA. In multiprocessor systems, each of processors 1610 may commonly, but not necessarily, implement the same ISA. In some implementations, graphics processing units (GPUs) may be used instead of, or in addition to, conventional processors.

System memory 1620 may be configured to store instructions and data accessible by processor(s) 1610. In at least some embodiments, the system memory 1620 may comprise both volatile and non-volatile portions; in other embodiments, only volatile memory may be used. In various embodiments, the volatile portion of system memory 1620 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 1620 as code 1625 and data 1626.

In some embodiments, I/O interface 1630 may be configured to coordinate I/O traffic between processor 1610, system memory 1620, and any peripheral devices in the device, including network interface 1640 or other peripheral interfaces such as various types of persistent and/or volatile storage devices. In some embodiments, I/O interface 1630 may perform any necessary protocol, timing or other data transformations to convert data signals from one component (e.g., system memory 1620) into a format suitable for use by another component (e.g., processor 1610). In some embodiments, I/O interface 1630 may include support for devices attached through various types of peripheral buses, such as a variant of the Peripheral Component Interconnect (PCI) bus standard or the Universal Serial Bus (USB) standard, for example. In some embodiments, the function of I/O interface 1630 may be split into two or more separate components, such as a north bridge and a south bridge, for example. Also, in some embodiments some or all of the functionality of I/O interface 1630, such as an interface to system memory 1620, may be incorporated directly into processor 1610.

Network interface 1640 may be configured to allow data to be exchanged between computing device 1600 and other devices 1660 attached to a network or networks 1650, such as other computer systems or devices as illustrated in FIG. 1 through FIG. 15, for example. In various embodiments, network interface 1640 may support communication via any suitable wired or wireless general data networks, such as types of Ethernet network, for example. Additionally, network interface 1640 may support communication via telecommunications/telephony networks such as analog voice networks or digital fiber communications networks, via storage area networks such as Fibre Channel SANs, or via any other suitable type of network and/or protocol.

In some embodiments, system memory 1620 may represent one embodiment of a computer-accessible medium configured to store at least a subset of program instructions and data used for implementing the methods and apparatus discussed in the context of FIG. 1 through FIG. 15. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 1600 via I/O interface 1630. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 1600 as system memory 1620 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 1640. Portions or all of multiple computing devices such as that illustrated in FIG. 16 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A server system, comprising:
a server chassis;
a pre-assembled computer system mounted in the server chassis, wherein the pre-assembled computer system is pre-assembled and pre-installed in a computer case of the pre-assembled computer system prior to being installed in the server chassis;
a baseboard management controller mounted external to the pre-assembled computer system; and
an electro-mechanical device positioned in the server chassis adjacent to a power button of the pre-assembled computer system,
wherein the baseboard management controller is configured to:
cause, based on a request received from a remote computing device, the electro-mechanical device to actuate such that the power button of the pre-assembled computer system is pressed.

2. The server system of claim 1, wherein the baseboard management controller is further configured to:
receive status information or data from system management components of the server system and from the pre-assembled computer system; and
determine, based on the received status information or data, to cause the electro-mechanical device to actuate such that the power button of the pre-assembled computer system is pressed.

3. The server system of claim 1, further comprising:
a virtualization offloading component coupled to the baseboard management controller, wherein:
the baseboard management controller includes one or more remote virtualization offloading controllers in communication with the virtualization offloading component, and
the virtualization offloading component is configured to, via the one or more remote virtualization offloading controllers:
permit or inhibit the baseboard management controller from causing the electro-mechanical device to actuate.

4. The server system of claim 1, wherein:
the power button of the pre-assembled computer system is located on a rounded corner of the computer case of the pre-assembled computer system; and
the electro-mechanical device is positioned in the chassis orthogonal to a tangent of the rounded corner of the computer case, such that the electro-mechanical device is not positioned orthogonal to any of a plurality of flat sides of the computer case of the pre-assembled computer system.

5. The server system of claim 1, wherein the pre-assembled computer system is a Mac Mini computer system manufactured by Apple, Inc.

6. The server system of claim 1, further comprising:
a mechanical linkage extending from a location adjacent to the power button of the pre-assembled computer system to an exterior panel of the server system,
wherein the mechanical linkage is configured to cause the power button of the pre-assembled computer system to be engaged when an exterior button of the mechanical linkage is pressed.

7. A device, comprising:
a server chassis,
a mounting device configured to secure a pre-assembled computer system in the server chassis, wherein the pre-assembled computer system is pre-assembled and pre-installed in a computer case of the pre-assembled computer system prior to being mounted in the mounting device;
an electro-mechanical device positioned in the server chassis such that the electro-mechanical device is configured to engage a power button of a pre-assembled computer system mounted in the mounting device, wherein the electro-mechanical device is configured to:
receive a signal from a baseboard management controller to actuate the electro-mechanical device; and
in response to receiving the signal, cause the electro-mechanical device to actuate such that the power button of the pre-assembled computer system is pressed.

8. The device of claim 7, further comprising:
a mechanical linkage extending from a location adjacent to the power button of the pre-assembled computer system to an exterior panel of the device,
wherein the mechanical linkage is configured to cause the power button of the pre-assembled computer system to be engaged when an exterior button of the mechanical linkage is pressed.

9. The device of claim 7,
wherein the electro-mechanical device and the mechanical linkage are configured to independently engage the power button of the pre-assembled computer system, such that actuation of the electro-mechanical device does not cause the mechanical linkage to move with the electro-mechanical device and pressing of the exterior button of the mechanical linkage does not cause the electro-mechanical device to move with the mechanical linkage.

10. The device of claim 7, wherein:
the electro-mechanical device is positioned in the server chassis to engage with a power button located on a rounded corner of a computer case of a pre-assembled computer system.

11. The device of claim 10, wherein the electro-mechanical device is configured to engage a cam coupled to the mounting device for the pre-assembled computer system, wherein the electro-mechanical device is configured to push the cam such that the cam presses a power button of a pre-assembled computer system mounted in the mounting device.

12. The device of claim 7, wherein:
the mounting device is configured to secure a computer system manufactured by Apple, Inc. in the server chassis; and
the electro-mechanical device is positioned in the chassis to press a power button of the computer system manufactured by Apple, Inc.

13. The device of claim 7, further comprising:
a baseboard management controller mounted in the server chassis, wherein the baseboard management controller is configured to:
cause, based on a request received from a remote computing device, the electro-mechanical device to actuate such that a power button of a pre-assembled computer system mounted in the mounting device is pressed.

14. The device of claim 13, further comprising:
a sensor configured to:
detect movement of a component associated with the electro-mechanical device or associated with a mechanical linkage; and
send a signal to the baseboard management controller indicating a button press of a power button of a pre-assembled computer system mounted in the mounting device has occurred.

15. The device of claim 13, wherein the baseboard management controller further comprises one or more remote virtualization controllers configured to:
permit or inhibit a system management processor from causing the electro-mechanical device to be actuated; and
cause the electro-mechanical device to be actuated, independent of the system management controller of the baseboard management controller.

16. The device of claim 15, further comprising:
a virtualization offloading component comprising a root of trust component for the device,
wherein the virtualization offloading component is configured to:
control the one or more remote virtualization controllers to permit, inhibit, or independently cause a button press of a power button of a pre-assembled computer system mounted in the mounting device to be performed.

17. The device of claim 13, further comprising an electronic power button mounted on an exterior panel of the device, wherein the baseboard management controller is configured to cause the electro-mechanical device to actuate in response to the electronic power button on the exterior panel being pressed.

18. A baseboard management controller storing program instructions, that when executed on or across one or more processors of the baseboard management controller, cause the one or more processors to:
receive a request message from a virtualization computer service regarding a power state of a pre-assembled computer system, wherein the baseboard management controller is mounted external to the pre-assembled computer system and is connected to the pre-assembled computer system via one or more cables; and
generate an output command that causes an electromechanical device mounted in a server chassis with the pre-assembled computer system to press a power button of the pre-assembled computer system.

19. The baseboard management controller of claim 18, wherein the baseboard management controller is configured to:
generate an output command that causes the electromechanical device to press the power button in accordance with a first timing sequence for one or more presses in response to receiving a first IPMI request message; and
generate an output command that causes the electromechanical device to press the power button in accordance with a second timing sequence for one or more presses in response to receiving a second IPMI request message.

20. The baseboard management controller of claim 19, wherein the first timing sequence causes the pre-assembled computer system to change its power state, from on to off, or, from off to on, and
wherein the second timing sequence causes the pre-assembled computer system to transition to a firmware update mode.

* * * * *